(12) United States Patent
Ido et al.

(10) Patent No.: US 10,825,654 B2
(45) Date of Patent: Nov. 3, 2020

(54) ION IMPLANTATION APPARATUS AND MEASUREMENT DEVICE

(71) Applicant: SUMITOMO HEAVY INDUSTRIES ION TECHNOLOGY CO., LTD., Tokyo (JP)

(72) Inventors: Noriyasu Ido, Ehime (JP); Hiroyuki Kariya, Ehime (JP); Masahide Ooura, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 16/270,236

(22) Filed: Feb. 7, 2019

(65) Prior Publication Data

US 2019/0244785 A1    Aug. 8, 2019

(30) Foreign Application Priority Data

Feb. 8, 2018    (JP) .................................. 2018-020944

(51) Int. Cl.
*H01J 37/317*    (2006.01)
*H01J 37/304*    (2006.01)
(Continued)

(52) U.S. Cl.
CPC ........ *H01J 37/3171* (2013.01); *H01J 37/023* (2013.01); *H01J 37/1474* (2013.01); *H01J 37/244* (2013.01); *H01J 37/304* (2013.01); *H01J 2237/24405* (2013.01); *H01J 2237/24535* (2013.01); *H01J 2237/31701* (2013.01)

(58) Field of Classification Search
CPC ........... H01J 37/3171; H01J 2237/2435; H01J 2237/24542; H01J 2237/24528
See application file for complete search history.

(56) References Cited

U.S. PATENT DOCUMENTS

| | | |
|---|---|---|
| 6,677,598 B1 | 1/2004 | Benveniste |
| 7,202,483 B2 | 4/2007 | Olson et al. |
| | (Continued) | |

FOREIGN PATENT DOCUMENTS

| | | |
|---|---|---|
| JP | 2005-063874 A | 3/2005 |
| JP | 2006-525644 A | 11/2006 |
| | (Continued) | |

*Primary Examiner* — Eliza W Osenbaugh-Stewart
(74) *Attorney, Agent, or Firm* — Michael Best & Friedrich LLP

(57) ABSTRACT

A measurement device includes a plurality of slits, a beam current measurement unit provided at a position away from the slits in a beam traveling direction, and a measurement control unit. The beam current measurement unit is configured to be capable of measuring a beam current at a plurality of measurement positions to be different positions in a first direction perpendicular to the beam traveling direction. The slits are disposed to be spaced apart in the first direction such that the first direction coincides with a slit width direction and are configured to be movable in the first direction. The measurement control unit acquires a plurality of beam current values measured at the plurality of measurement positions to be the different positions in the first direction with the beam current measurement unit while moving the slits in the first direction.

23 Claims, 14 Drawing Sheets

(51) Int. Cl.
*H01J 37/02* (2006.01)
*H01J 37/244* (2006.01)
*H01J 37/147* (2006.01)

(56) References Cited

U.S. PATENT DOCUMENTS

| | | |
|---|---|---|
| 7,351,987 B2 | 4/2008 | Kabasawa et al. |
| 7,394,073 B2 | 7/2008 | Cummings et al. |
| 9,449,791 B2 | 9/2016 | Tsukihara et al. |
| 9,502,210 B2 | 11/2016 | Sano et al. |
| 9,564,292 B2 | 2/2017 | Ido et al. |
| 2005/0191409 A1* | 9/2005 | Murrell ................. H01J 37/304 427/8 |
| 2008/0142727 A1* | 6/2008 | Ryding ................. H01J 37/244 250/400 |
| 2015/0001418 A1* | 1/2015 | Ido ...................... H01J 37/3171 250/397 |

FOREIGN PATENT DOCUMENTS

| | | |
|---|---|---|
| JP | 2008-146863 A | 6/2008 |
| JP | 2008-257931 A | 10/2008 |
| JP | 2009-524195 A | 6/2009 |
| JP | 2010-050108 A | 3/2010 |
| JP | 4901094 B2 | 3/2012 |
| JP | 2016-004614 A | 1/2016 |
| JP | 2016-039092 A | 3/2016 |
| JP | 6150632 B2 | 6/2017 |
| WO | WO-2007/087209 A1 | 8/2007 |

* cited by examiner

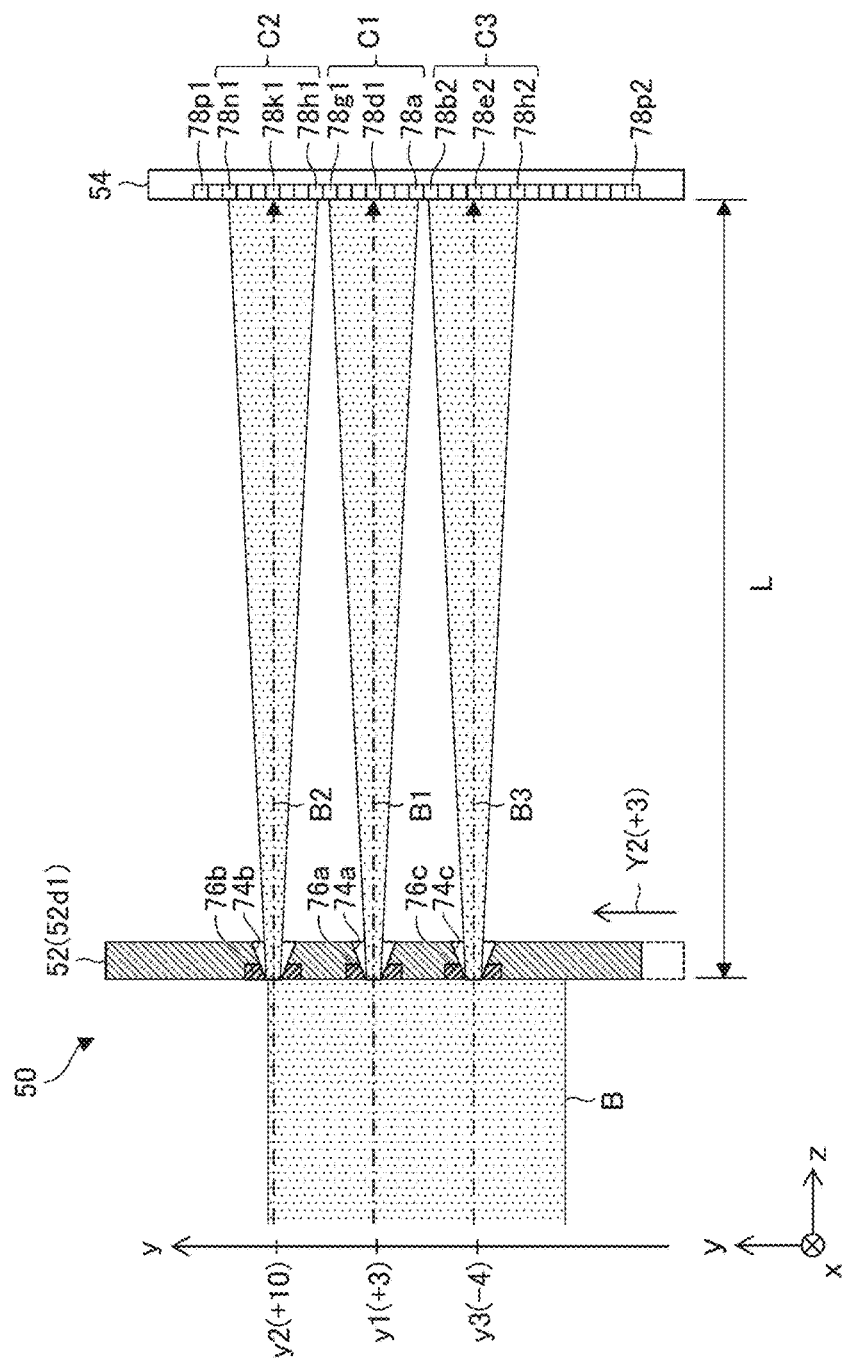

ION IMPLANTATION APPARATUS AND MEASUREMENT DEVICE

RELATED APPLICATIONS

Priority is claimed to Japanese Patent Application No. 2018-020944, filed Feb. 8, 2018, the entire content of which is incorporated herein by reference.

BACKGROUND

Technical Field

Certain embodiments of the invention relate to an ion implantation apparatus and a measurement device.

Description of Related Art

In semiconductor manufacturing processes, a process for implanting ions into a semiconductor wafer (also referred to as an ion implantation process) is conducted as a standard for a change in semiconductor conductivity, a change in the crystal structure of a semiconductor, and the like. It is known that the manner of interaction between an ion beam and a wafer varies with the angle of the ion beam with which the wafer is irradiated and this variation affects ion implantation processing results. The angular distribution of the ion beam is measured before ion implantation. For example, the current value of the beam that has passed through a slit is measured at a plurality of electrodes lining up in the width direction of the slit, and then the angular distribution in the slit width direction can be obtained (see, for example, the related art).

SUMMARY

An ion implantation apparatus according to an embodiment of the invention includes a beamline device configured to transport an ion beam with which a wafer is irradiated and a measurement device configured to measure angle information on the ion beam. The measurement device includes a plurality of slits through which a part of the ion beam passes, a beam current measurement unit provided at a position away from the plurality of slits in a beam traveling direction, and a measurement control unit. The beam current measurement unit is configured to be capable of measuring a beam current at a plurality of measurement positions to be different positions in a first direction perpendicular to the beam traveling direction. The plurality of slits are disposed to be spaced apart in the first direction such that the first direction coincides with a slit width direction and are configured to be movable in the first direction. The measurement control unit acquires a plurality of beam current values measured at the plurality of measurement positions to be the different positions in the first direction with the beam current measurement unit while moving the plurality of slits in the first direction.

Another embodiment of the invention relates to a measurement device. This device is a measurement device measuring angle information on an ion beam, including a plurality of slits through which a part of the ion beam passes, a beam current measurement unit that is provided at a position away from the plurality of slits in a beam traveling direction, and a measurement control unit. The beam current measurement unit is configured to be capable of measuring a beam current at a plurality of measurement positions to be different positions in a first direction perpendicular to the beam traveling direction. The plurality of slits are disposed to be spaced apart in the first direction such that the first direction coincides with a slit width direction and are configured to be movable in the first direction. The measurement control unit acquires a plurality of beam current values measured at the plurality of measurement positions to be the different positions in the first direction with the beam current measurement unit while moving the plurality of slits in the first direction.

It is to be noted that any combination of the above constituent elements and mutual substitutions of constituent elements and expressions of the embodiments of the invention among methods, apparatuses, systems, and so on are also effective as aspects of the embodiments of the invention.

BRIEF DESCRIPTION OF THE DRAWINGS

FIG. 8 is a side view schematically illustrating an example of beam angular distribution measurement by the measurement device.

DETAILED DESCRIPTION

Figure 1:
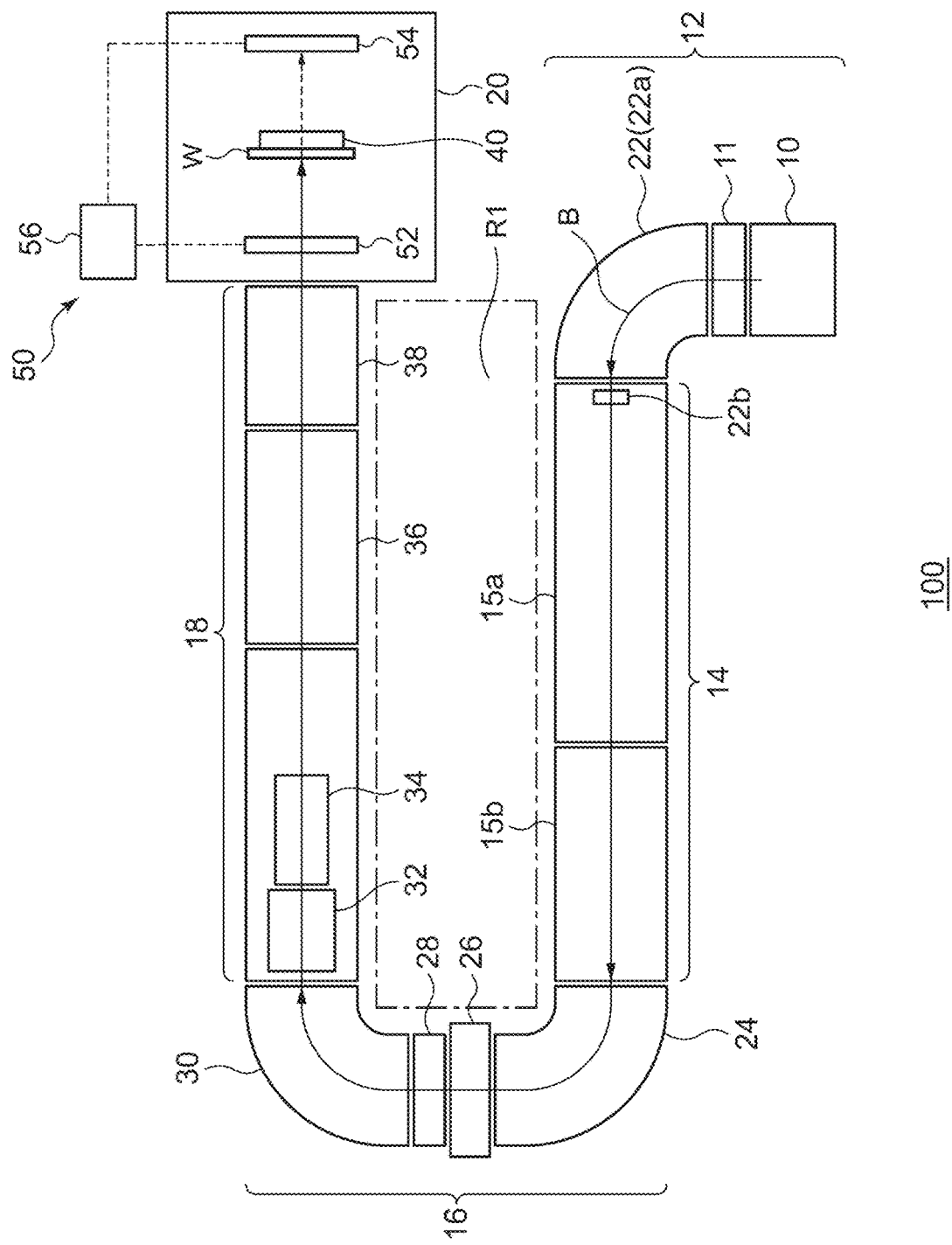
FIG. 1 is a top view schematically illustrating an ion implantation apparatus according to an embodiment.

In order to appropriately grasp ion beam angle information, it is preferable to obtain not only the angular distribution at a specific position within the beam cross section but also the angular distribution over the entire of the beam. However, the overall beam angular distribution measurement takes time as angle measurement needs to be performed at a plurality of positions within the beam cross section while the slit is moved in a beam-crossing direction. For throughput improvement in semiconductor manufacturing process, it is preferable that the angular distribution of the beam can be evaluated within a shorter time.

It is desirable to provide a technique for quickly evaluating the angular distribution of an ion beam.

According to the embodiments of the invention, the angular distribution of an ion beam can be evaluated in a swift manner.

Hereinafter, modes for carrying out embodiments of the invention will be described in detail with reference to accompanying drawings. In the description of the drawings, the same elements are denoted by the same reference numerals, and duplicate description will be omitted as appropriate. In addition, the following configuration is an example, and does not limit the scope of the embodiments of the invention.

FIG. 1 is a top view schematically illustrating an ion implantation apparatus 100 according to an embodiment of the invention. The ion implantation apparatus 100 is a so-called high energy ion implantation apparatus. The high energy ion implantation apparatus is an ion implantation apparatus that has a radio frequency linear acceleration-type ion acceleration unit and a beamline for high energy ion transport, accelerates ions generated at an ion source 10, transports a resultant ion beam B along the beamline to an object to be processed (such as a substrate or a wafer W), and implants the ions into the object to be processed.

The high energy ion implantation apparatus 100 is provided with an ion beam generation unit 12 generating ions and performing mass analysis, a high energy multistage linear acceleration unit 14 accelerating an ion beam into a high energy ion beam, a beam deflection unit 16 performing energy analysis, trajectory correction, and energy dispersion control of the high energy ion beam, a beam transport line unit 18 transporting the analyzed high energy ion beam to the wafer W, and a substrate transporting/processing unit 20 implanting the transported high energy ion beam into a semiconductor wafer.

The ion beam generation unit 12 has the ion source 10, an extraction electrode 11, and a mass analyzer 22. In the ion beam generation unit 12, a beam is extracted from the ion source 10 through the extraction electrode 11 and accelerated simultaneously, and the extracted and accelerated beam is mass-analyzed by the mass analyzer 22. The mass analyzer 22 has a mass analyzing magnet 22a and a mass analyzing slit 22b. Although the mass analyzing slit 22b may be disposed immediately downstream of the mass analyzing magnet 22a, the mass analyzing slit 22b in the example is disposed in the entrance portion of the high energy multistage linear acceleration unit 14, which is the following configuration. As a result of the mass analysis by the mass analyzer 22, only the ion species that is necessary for implantation is selected, and the ion beam of the selected ion species is led to the following high energy multistage linear acceleration unit 14.

The high energy multistage linear acceleration unit 14 is provided with a plurality of linear accelerators, that is, acceleration gaps which are disposed upstream and downstream of one or more radio frequency resonators and accelerates the ion beam. The high energy multistage linear acceleration unit 14 is capable of accelerating ions by the action of a radio frequency (RF) electric field. The high energy multistage linear acceleration unit 14 is provided with a first linear acceleration unit 15a that is provided with a standard multistage of radio frequency resonators for high energy ion implantation. In addition, the high energy multistage linear acceleration unit 14 may be provided with a second linear acceleration unit 15b that is provided with an additional multistage of radio frequency resonators for ultra-high energy ion implantation. The direction of the ion beam further accelerated by the high energy multistage linear acceleration unit 14 is changed by the beam deflection unit 16.

The high energy ion beam exiting from the radio frequency-type high energy multistage linear acceleration unit 14 accelerating an ion beam to high energy has a certain range of energy distribution. Accordingly, for beam scanning and beam parallelization to be performed on the high energy ion beam in downstream of the high energy multistage linear acceleration unit 14 and for beam irradiation to a wafer, high accuracy energy analysis, trajectory correction, and beam convergence and divergence adjustment need to be performed in advance.

The beam deflection unit 16 performs energy analysis, trajectory correction, and energy dispersion control of the high energy ion beam. The beam deflection unit 16 is provided with at least two high accuracy deflecting electromagnets, at least one energy width limiting slit, at least one energy analysis slit, and at least one horizontally focusing instrument. The deflecting electromagnets are configured to perform energy analysis, precise ion implantation angle correction, and energy dispersion suppression of the high energy ion beam.

The beam deflection unit 16 has an energy analyzing electromagnet 24, a horizontally focusing quadrupole lens 26 which is suppressing energy dispersion, an energy analysis slit 28, and a deflecting electromagnet 30 providing beam steering (trajectory correction). The energy analyzing electromagnet 24 is sometimes called an energy filter electromagnet (EFM). The high energy ion beam heads towards the wafer W after the direction of the high energy ion beam is changed by the beam deflection unit 16.

The beam transport line unit 18 is a beamline device transporting the ion beam B exiting from the beam deflection unit 16, and has a beam shaper 32 configured with focusing/defocusing lens groups, a beam scanner 34, a beam parallelizing unit 36, and a final energy filter 38 (including a final energy separating slit). The length of the beam transport line unit 18 is designed in accordance with the total length of the ion beam generation unit 12 and the high energy multistage linear acceleration unit 14. The implanter 100 forms a layout that has a U shape as a whole by connecting the beam transport line unit 18 and the high energy multistage linear acceleration unit 14 with the beam deflection unit 16.

The substrate transporting/processing unit 20 is provided at the downstream terminal end of the beam transport line unit 18. The substrate transporting/processing unit 20 is provided with a platen drive device 40 holding the wafer W during ion implantation and moving the wafer W in a direction perpendicular to the beam scanning direction. In addition, the substrate transporting/processing unit 20 is provided with a measurement device 50 for measuring the beam current and the angular distribution of the ion beam B. The measurement device 50 is provided with a mask plate 52 provided with a plurality of slits, a beam current measurement unit 54 measuring the beam that has passed through the mask plate 52, and a measurement control unit 56 calculating the angular distribution of the beam from a measured beam current value. The configuration of the measurement device 50 will be described in detail later.

The beamline portion of the ion implantation apparatus 100 is configured as a horizontal and U-shaped folded beamline that has two long linear portions facing each other. A plurality of units accelerating the ion beam B generated by the ion beam generation unit 12 constitute the upstream long linear portion. A plurality of units adjusting the ion beam B changed in direction with respect to the upstream long linear portion and implanting the ion beam B into the wafer W constitute the downstream long linear portion. The two long linear portions are configured to have substantially the same length. Provided between the two long linear portions is a workspace R1, which has a sufficient area for maintenance work.

Figure 2:
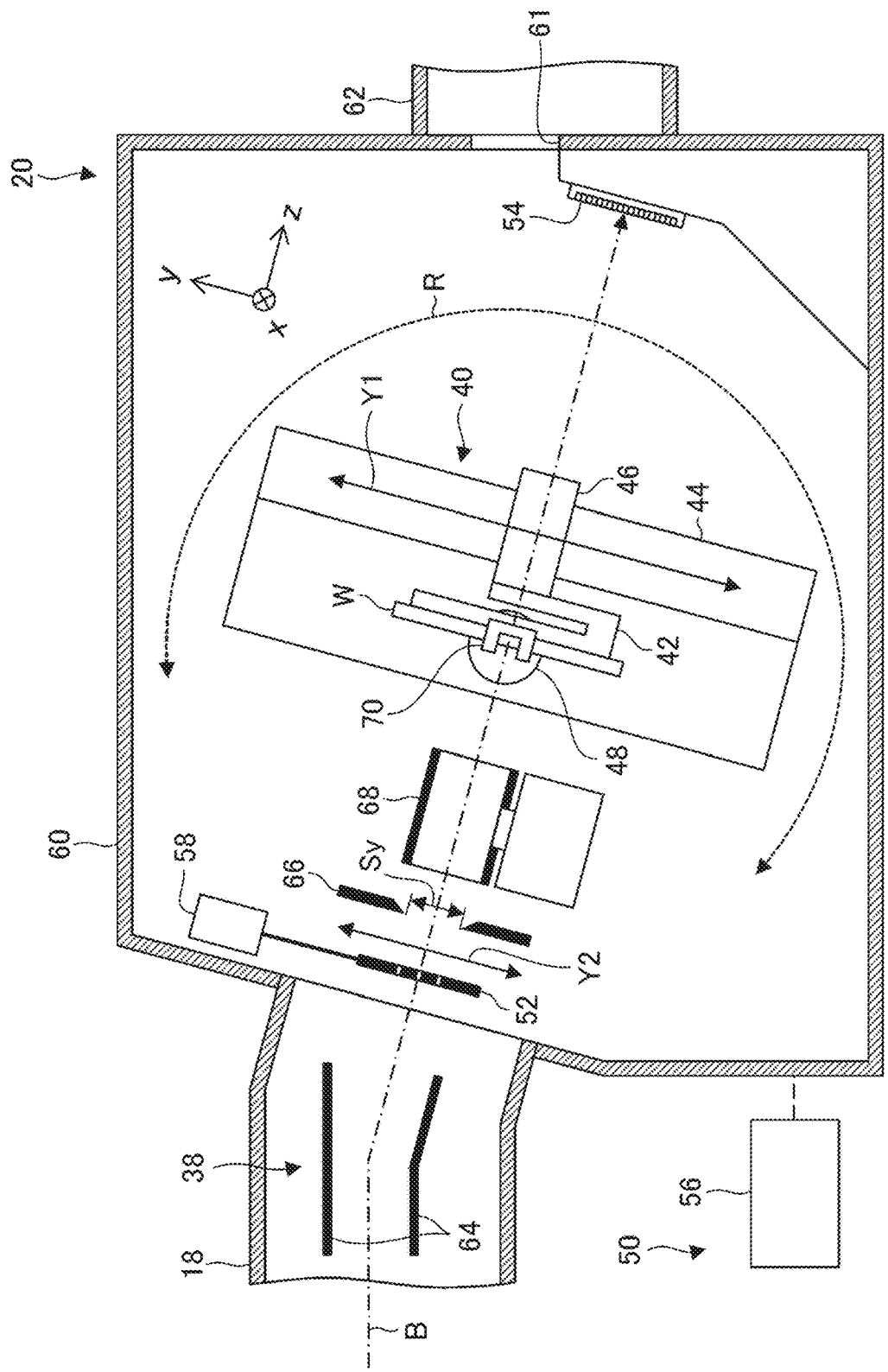
FIG. 2 is a side view illustrating the configuration of a substrate transport processing unit in detail.

FIG. 2 is a side view illustrating the configuration of the substrate transporting/processing unit 20 in detail and illustrating the configuration on the downstream side of the final energy filter 38. The ion beam B is deflected downwards by an angular energy filter (AEF) electrodes 64 of the final energy filter 38, and the ion beam B is incident into the substrate transporting/processing unit 20. The substrate transport processing unit 20 includes an implantation process chamber 60 in which anion implantation process is executed and a substrate transport unit 62 provided with a transport mechanism for transporting the wafer W. The implantation process chamber 60 and the substrate transport unit 62 are connected to each other via a substrate transport port 61.

The implantation process chamber 60 is provided with the platen drive device 40 holding the at least one wafer W. The platen drive device 40 includes a wafer holding device 42, a reciprocating mechanism 44, a twist angle adjustment mechanism 46, and a tilt angle adjustment mechanism 48. The wafer holding device 42 includes, for example, an electrostatic chuck for holding the wafer W. By causing the wafer holding device 42 to reciprocate in a reciprocating direction (the y direction) perpendicular to the beam scanning direction (the x direction), the reciprocating mechanism 44 causes the wafer W held by the wafer holding device 42 to reciprocate in the y direction. The arrow Y1 in FIG. 2 exemplifies the reciprocating motion of the wafer W.

The twist angle adjustment mechanism 46 is a mechanism adjusting the rotational angle of the wafer W. By rotating the wafer W about a normal line on a wafer processing surface, the twist angle adjustment mechanism 46 adjusts the twist angle between a reference position and an alignment mark provided in an outer peripheral portion of the wafer. Here, the alignment mark of the wafer means a notch or an orientation flat provided in the outer peripheral portion of the wafer and a mark serving as a reference of an angular position in a crystal axial direction of the wafer or a circumferential direction of the wafer. The twist angle adjustment mechanism 46 is provided between the wafer holding device 42 and the reciprocating mechanism 44 and is caused to reciprocate with the wafer holding device 42.

The tilt angle adjustment mechanism 48 is a mechanism adjusting the tilt of the wafer W and adjusts the tilt angle between the traveling direction (the z direction) of the ion beam B directed to the wafer processing surface and the normal line on the wafer processing surface. In the present embodiment, an angle having an axis in the x direction as the central axis of rotation among the inclination angles of the wafer W is adjusted as the tilt angle. The tilt angle adjustment mechanism 48 is provided between the reciprocating mechanism 44 and the inner wall of the implantation process chamber 60. The tilt angle adjustment mechanism 48 is configured to adjust the tilt angle of the wafer W by rotating the entire platen drive device 40 including the reciprocating mechanism 44 in an R direction.

In the implantation process chamber 60, the mask plate 52, an energy slit 66, a plasma shower device 68, and the beam current measurement unit 54 (also referred to as a first beam current measurement unit 54) are provided from the upstream side toward the downstream side along the trajectory of the ion beam B. The implantation process chamber 60 is provided with a second beam current measurement unit 70 configured to be insertable into an "implantation position" where the wafer W during ion implantation.

The mask plate 52 is a beam shielding body provided with a plurality of slits. The mask plate 52 is provided with at least one vertical slit in which the slit width direction is the x direction and at least one horizontal slit in which the slit width direction is the y direction. A part of the beam that has passed through the slit provided in the mask plate 52 is measured by the first beam current measurement unit 54 and the second beam current measurement unit 70 on the downstream side. The mask plate 52 is attached to a mask drive mechanism 58 and is configured to be movable in the y direction. The mask drive mechanism 58 is configured to move the mask plate 52 in the y direction. By moving in the y direction during measurement, the mask plate 52 changes the position in the beam cross section of the beam portion cut by the slit provided in the mask plate 52. The mask plate 52 is disposed on the beam trajectory during measurement and is retracted from the beam trajectory during implantation.

The energy slit 66 is provided on the downstream side of the AEF electrodes 64 and performs energy analysis, with the AEF electrodes 64, on the ion beam B incident into the wafer W. The energy slit 66 is an energy defining slit (EDS), and a slit that is horizontally elongated in the beam scanning direction (the x direction) constitutes the energy slit 66. The energy slit 66 allows the ion beam B having a desired energy value or energy range allowed to pass toward the wafer W and shields other ion beams.

The plasma shower device 68 is positioned on the downstream side of the energy slit 66. The plasma shower device 68 supplies low energy electrons to the ion beam and the wafer processing surface in accordance with the beam current of the ion beam B and suppresses the charge-up due to the positive charge on the wafer processing surface that results from ion implantation. The plasma shower device 68 includes, for example, a shower tube through which the ion beam B passes and a plasma generating device supplying electrons into the shower tube.

The first beam current measurement unit 54 is provided on the most downstream side of the beam trajectory and is attached, for example, below the substrate transport port 61. Accordingly, in a case where the wafer W and the second beam current measurement unit 70 are not present on the beam trajectory, ion beam B is incident into the beam current measurement unit 54. The beam current measurement unit 54 is configured to be capable of measuring with the mask plate 52 the angular distribution in the y direction of the ion beam B. Angular resolution can be enhanced by providing the beam current measurement unit 54 on the most downstream side away from the mask plate 52.

The second beam current measurement unit 70 is to measure the beam current on the surface of the wafer W (the wafer processing surface). The second beam current measurement unit 70 is movable, is retracted from the wafer position during implantation, and is inserted into the wafer position when the wafer W is not at the implantation position. For example, the second beam current measurement unit 70 measures the beam current while moving in the x direction to measure the beam current density distribution in the beam scanning direction (the x direction). The second beam current measurement unit 70 may be configured to be capable of measuring, with the mask plate 52, the angular distribution in at least one of the x direction and the y direction of the ion beam B.

Figure 3A:
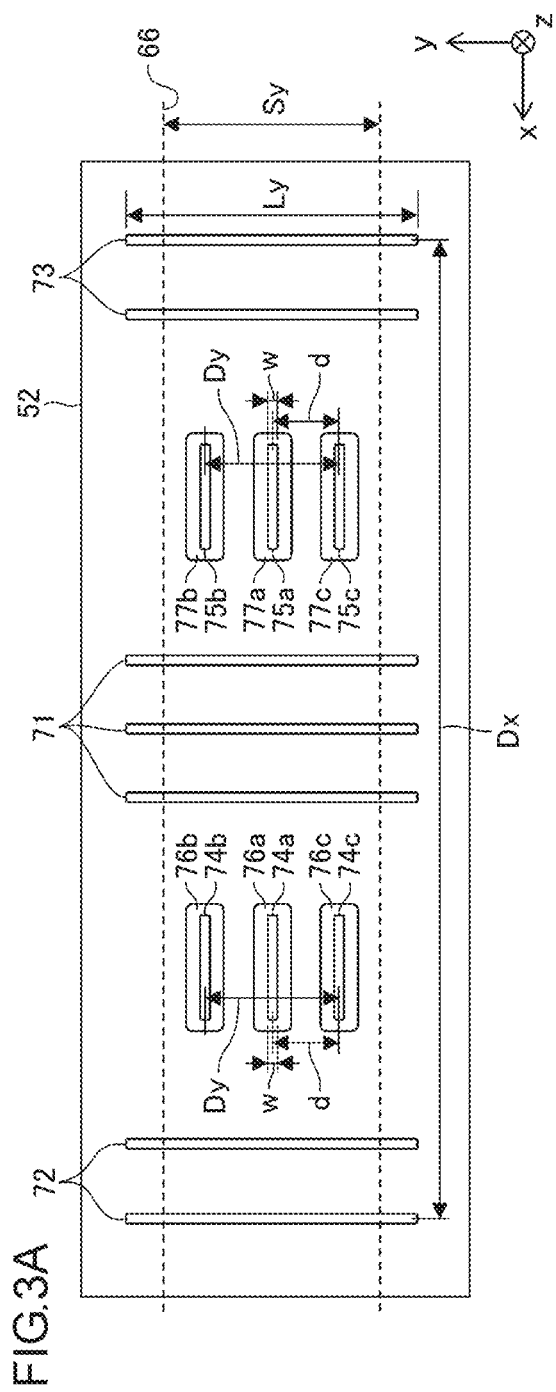
FIGS. 3A and 3B are plan views schematically illustrating the configurations of a mask plate and a beam current measurement unit.
Figure 3B:
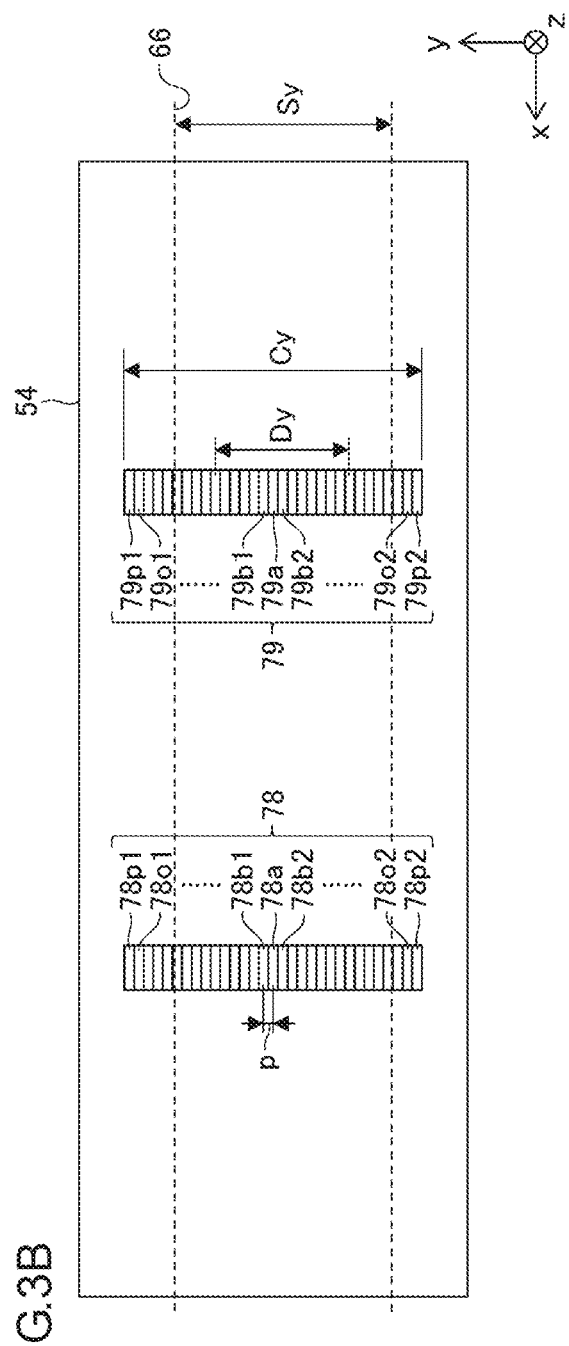

FIGS. 3A and 3B are plan views schematically illustrating the configurations of the mask plate 52 and the beam current measurement unit 54. The configuration of the mask plate 52 is illustrated in FIG. 3A. The mask plate 52 is provided with a plurality of vertical slits 71, 72, and 73 and a plurality of horizontal slits 74a, 74b, 74c, 75a, 75b, and 75c.

The three first vertical slits 71 are provided in the middle of the mask plate 52, the two second vertical slits 72 are provided on the left side of the mask plate 52, and the two third vertical slits 73 are provided on the right side of the mask plate 52. The slit width is the x direction in each of the vertical slits 71 to 73, and each of the vertical slits 71 to 73 is disposed with an interval in the x direction. The vertical slits 71 to 73 are used for measuring the angle information in the x direction of the ion beam B. Although three vertical slits are provided in the middle, two vertical slits are provided in the left, and two vertical slits are provided in the right in the illustrated example, the number and disposition of the vertical slits are not limited thereto. Any one of the illustrated vertical slits 71 to 73 may not be provided and another vertical slit may be added.

The plurality of first horizontal slits 74a, 74b, and 74c (also collectively referred to as first horizontal slits 74) are provided on the middle left side of the mask plate 52, and the plurality of second horizontal slits 75a, 75b, and 75c (also collectively referred to as second horizontal slits 75) are provided on the middle right side of the mask plate 52. The slit width w is the y direction in each of the horizontal slits 74 and 75, and each of the horizontal slits 74 and 75 is disposed with an interval in the y direction. The horizontal slits 74 and 75 are used for measuring the angle information in the y direction of the ion beam B.

In the illustrated example, the plurality of first horizontal slits 74 are constituted by three horizontal slits, that is, the first middle horizontal slit 74a, the first upper horizontal slit 74b, and the first lower horizontal slit 74c. Likewise, the plurality of second horizontal slits 75 are constituted by three horizontal slits, that is, the second middle horizontal slit 75a, the second upper horizontal slit 75b, and the second lower horizontal slit 75c. The number and disposition of the horizontal slits are not limited thereto. For example, a horizontal slit may be disposed in the middle of the mask plate 52 instead of a vertical slit. Also, the number of horizontal slits lining up in the y direction may be two, an even number of four or more (such as four and six), or an odd number of five or more (such as five and seven).

Both the first horizontal slits 74a to 74c and the second horizontal slits 75a to 75c are disposed side by side in the y direction with equal intervals (pitches) of d, respectively. The interval d in the y direction between the horizontal slits 74a to 74C or the horizontal slits 75a to 75c is, for example, configured to be an integer multiple of the slit width w and configured to be at least five times the slit width. In the illustrated example, the interval d in the y direction between the horizontal slits 74 a to 74c or the horizontal slits 75a to 75c is set to be seven times the slit width w (that is, d=7w). The interval d in the y direction between the horizontal slits 74 a to 74c or the horizontal slits 75a to 75c is not limited thereto, and can be appropriately set in accordance with the magnitude of the standard angular distribution of the ion beam B to be a measurement object.

First beam current detection units 76a, 76b, and 76c (also collectively referred to as first beam current detection units 76) are provided around the openings of the first horizontal slits 74a to 74c, respectively. The first middle beam current detection unit 76a is provided around the first middle horizontal slit 74a, the first upper beam current detection unit 76b is provided around the first upper horizontal slit 74b, and the first lower beam current detection unit 76c is provided around the first lower horizontal slit 74c. It is preferable that the first beam current detection units 76a to 76c are provided adjacent to the corresponding first horizontal slits 74a to 74c. By providing the first beam current detection units 76a to 76c in proximity to the first horizontal slits 74a to 74c, it is possible to detect a beam current having a value corresponding to the beam portion passing through the first horizontal slits 74a to 74c. Likewise, second beam current detection units 77a, 77b, and 77c (also collectively referred to as second beam current detection units 77) are provided around the openings of the second horizontal slits 75a to 75c, respectively. The detection result of each of the beam current detection units 76 and 77 is sent to the measurement control unit 56.

In the mask plate 52, the positions and ranges where the vertical slits 71 to 73 and the horizontal slits 74 and 75 are formed are preferably determined in accordance with the position in the y direction of the energy slit 66 indicated by the dashed line. For example, a range Ly in the y direction where the vertical slits 71 to 73 are formed is preferably wider than a width Sy in the y direction of the energy slit 66 and more preferably sufficiently wider than the width Sy. A range Dy in the y direction where the horizontal slits 74 and 75 are formed is preferably narrower than the width Sy in the y direction of the energy slit 66 and more preferably sufficiently narrower than the width Sy in view of the deviation and divergence/convergence in the y direction of the beam. A range Dx in the x direction from the second vertical slit 72 at the left end to the third vertical slit 73 at the right end is preferably within the scanning range in the scanning direction of the ion beam B. For example, it is preferable that the range Dx corresponds to the width in the x direction of the wafer W to be an implantation object.

The configuration of the beam current measurement unit 54 is illustrated in FIG. 3B. The beam current measurement unit 54 is provided with a plurality of first electrodes 78 and a plurality of second electrodes 79. The plurality of first electrodes 78 are disposed side by side in a line in the y direction. Likewise, the plurality of second electrodes 79 are also disposed side by side in a line in the y direction. The plurality of first electrodes 78 and the plurality of second electrodes 79 are disposed with equal intervals of pitch p in the y direction and are configured such that, for example, the pitch p is equal to the slit width w of the horizontal slits 74 and 75 described above. The beam current measurement unit 54 measures beam current values at a plurality of measurement positions to be different positions in the y direction with the plurality of first electrodes 78 and the plurality of second electrodes 79. The measurement results of the first electrodes 78 and the second electrodes 79 are sent to the measurement control unit 56.

The plurality of first electrodes 78 are disposed on the middle left side of the beam current measurement unit 54 and are provided at positions into which the beam portion that has passed through the first horizontal slits 74a to 74c is incident. In other words, the plurality of first electrodes 78 are provided at positions facing the plurality of first horizontal slits 74 in the beam traveling direction (the z direction) when the mask plate 52 is disposed on the beam trajectory. Likewise, the plurality of second electrodes 79 are disposed on the middle right side of the beam current measurement unit 54 and are provided at positions into which the beam that has passed through the second horizontal slits 75a to 75c is incident.

A section Cy in the y direction in which the plurality of first electrodes 78 and the plurality of second electrodes 79 are provided is larger than the range Dy in the y direction in which the horizontal slits 74 and 75 are provided. For example, the section Cy is larger than a range Dy (=2d) in the y direction from the first upper horizontal slit 74$b$ to the first lower horizontal slit 74$c$. The difference between the section Cy in the y direction in which the plurality of first electrodes 78 and the plurality of second electrodes 79 are provided and the range Dy in the y direction in which the horizontal slits 74 and 75 are provided is, for example, at least twice the interval (the pitch) d in the y direction of the horizontal slits 74 and 75 (that is, Cy−Dy≥2d). In the illustrated example, the number of the plurality of first electrodes 78 is thirty one and the number of the plurality of second electrodes 79 is also thirty one, and the section Cy in the y direction in which the plurality of first electrodes 78 and the plurality of second electrodes 79 are provided is at least four times the interval (the pitch) d in they direction of the horizontal slits 74 or 75. In addition, in view of the deviation and divergence/convergence in the y direction of the beam, it is preferable that the section Cy in the y direction in which the plurality of first electrodes 78 and the plurality of second electrodes 79 are provided is larger than the width Sy in the y direction of the energy slit 66.

The plurality of first electrodes 78 include a first middle electrode 78$a$ positioned in the middle in the y direction, a first upper end electrode 78$p$1 positioned at the upper end in they direction, and a first lower end electrode 78$p$2 positioned at the lower end in the y direction. The plurality of first electrodes 78 further include a plurality of (for example, fourteen) first upper electrodes 78$b$1 to 78$o$1 disposed between the first middle electrode 78$a$ and the first upper end electrode 78$p$1 and a plurality of (for example, fourteen) first lower electrodes 78$b$2 to 78$o$2 disposed between the first middle electrode 78$a$ and the first lower end electrode 78$p$2. Likewise, the plurality of second electrodes 79 include a second middle electrode 79$a$ positioned in the middle in the y direction, a second upper end electrode 79$p$1 positioned at the upper end in the y direction, and a second lower end electrode 79$p$2 positioned at the lower end in the y direction. The plurality of second electrodes 79 further include a plurality of (for example, fourteen) second upper electrodes 79$b$1 to 79$o$1 disposed between the second middle electrode 79$a$ and the second upper end electrode 79$p$1 and a plurality of (for example, fourteen) second lower electrodes 79$b$2 to 79$o$2 disposed between the second middle electrode 79$a$ and the second lower end electrode 79$p$2.

Figure 4:
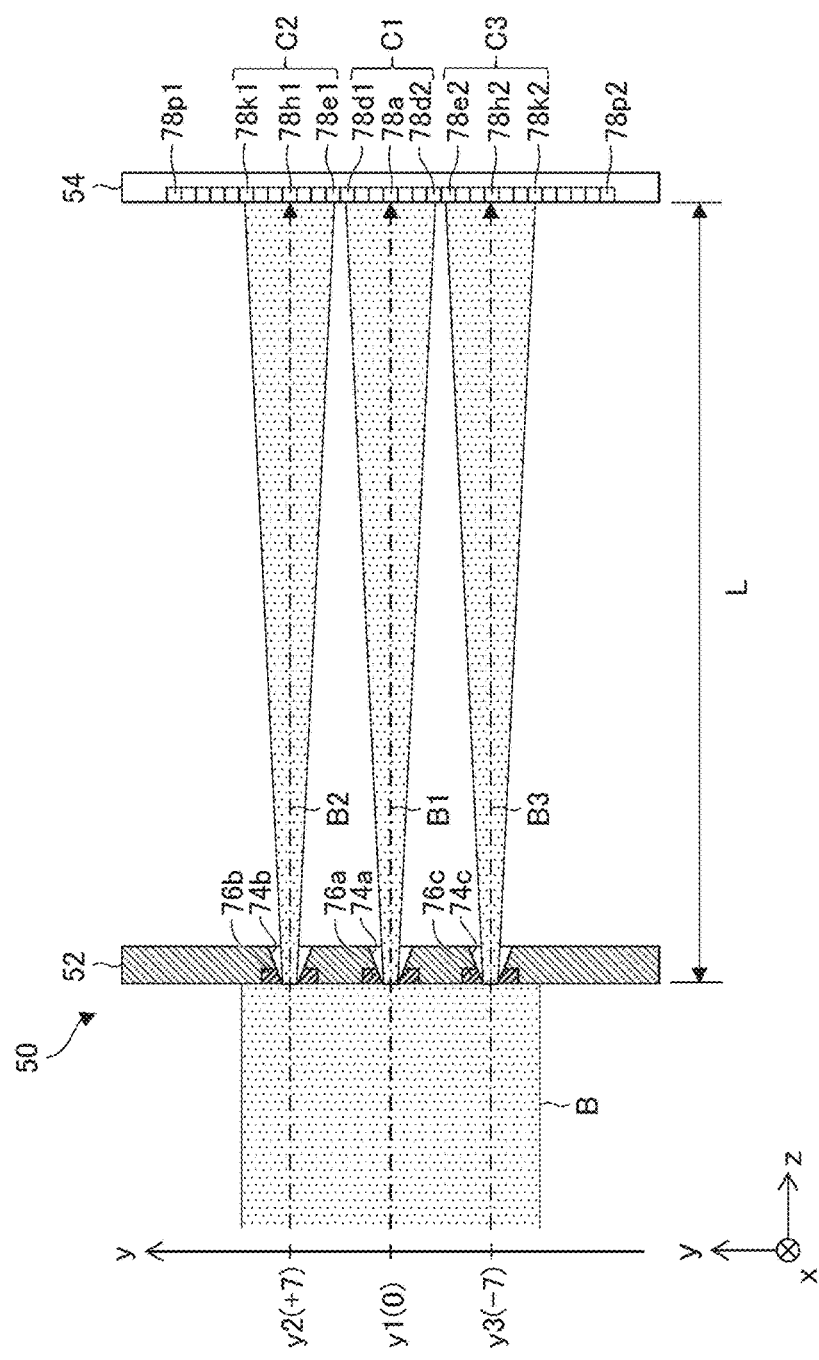
FIG. 4 is a side view schematically illustrating an example of beam angular distribution measurement by a measurement device.

FIG. 4 is a side view schematically illustrating an example of beam angular distribution measurement by the measurement device 50. Illustrated in FIG. 4 are beam portions B1, B2, and B3 incident into the plurality of first electrodes 78 of the beam current measurement unit 54 after passing through the first horizontal slits 74$a$ to 74$c$ of the mask plate 52, respectively. In the drawing, the mask plate 52 is disposed such that the first middle electrode 78$a$ is positioned on the front face of the first middle horizontal slit 74$a$. As a result, the seventh first upper electrode 78$h$1 is positioned on the front face of the first upper horizontal slit 74$b$ and the seventh first lower electrode 78$h$2 is positioned on the front face of the first lower horizontal slit 74$c$.

Since the ion beam B incident into the mask plate 52 has an angular distribution in the y direction, the beam portions B1 to B3 respectively passing through the first horizontal slits 74$a$ to 74$c$ spread in the y direction and are incident into the beam current measurement unit 54 after the slit passage. As a result, the beam parts B1 to B3 after the slit passage are incident into the plurality of first electrodes 78 positioned in measurement ranges C1 to C3 wider in the y direction than the slit width w in the y direction, respectively. For example, the first beam portion B1 passing through the first middle horizontal slit 74$a$ is incident into a plurality of first electrodes 78$d$1 to 78$d$2 positioned in the first measurement range C1 having the first middle electrode 78$a$ at its center. Likewise, the second beam portion B2 passing through the first upper horizontal slit 74$b$ is incident into the plurality of first electrodes 78$e$1 to 78$k$1 positioned in the second measurement range C2 having the seventh first upper electrode 78$h$1 at its center. The third beam portion B3 passing through the first lower horizontal slit 74$c$ is incident into the plurality of first electrodes 78$e$2 to 78$k$2 positioned in the third measurement range C3 having the seventh first lower electrode 78$h$2 at its center.

Figure 5A:
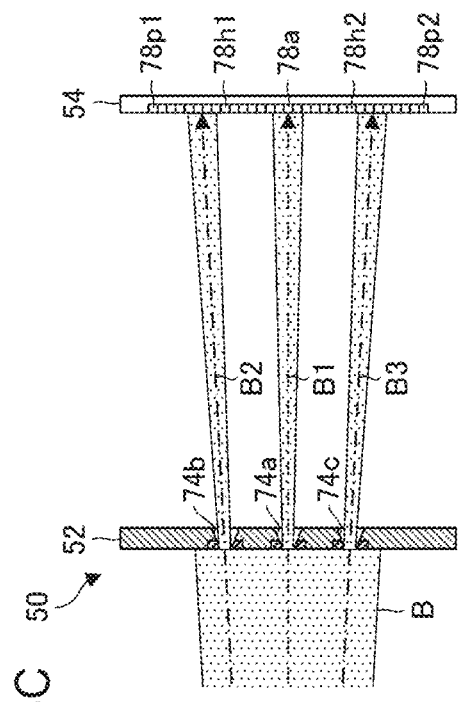
FIGS. 5A to 5D are side views schematically illustrating measurement examples of beams having different angular distributions.
Figure 5C:
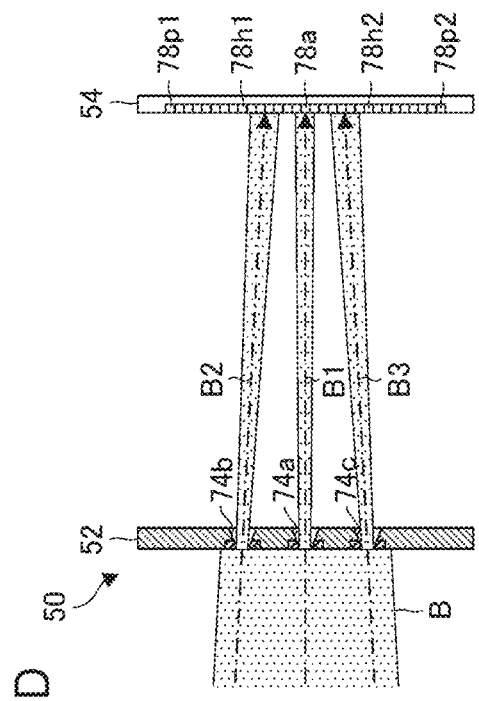
Figure 5B:
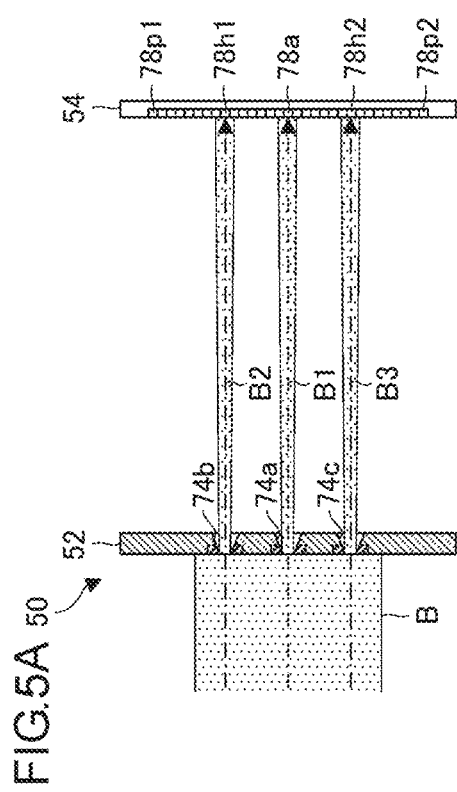
Figure 5D:
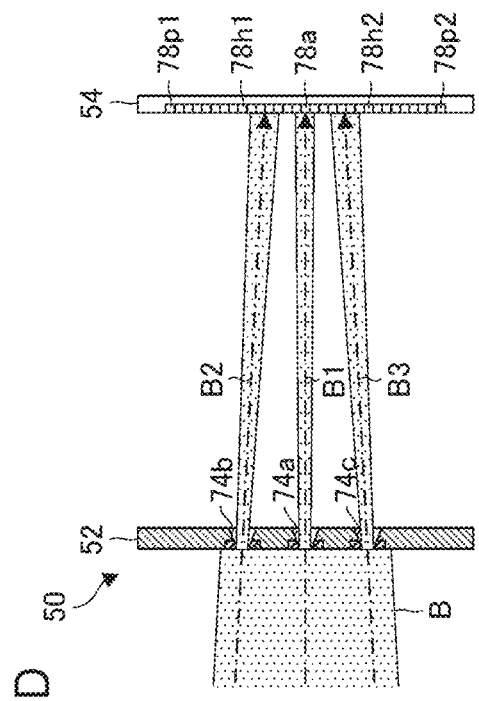

The measurement ranges C1 to C3 into which the respective beam parts B1 to B3 are actually incident may vary in accordance with the angular distribution in the y direction of the ion beam B. FIGS. 5A to 5D are side views schematically illustrating measurement examples of beams having different angular distributions. In the case of a beam that has a relatively small angular distribution as illustrated in FIG. 5A, the beam portions B1 to B3 are c incident into only a smaller number of electrodes. In a case where the traveling direction of the ion beam B is inclined with respect to the z direction as illustrated in FIG. 5B, the beam portions B1 to B3 are incident into ranges different from the measurement ranges C1 to C3 illustrated in FIG. 4. Also in the case of the divergent beam illustrated in FIG. 5C or the convergent beam illustrated in FIG. 5D, the beam portions B1 to B3 are incident into ranges different from the measurement ranges C1 to C3 illustrated in FIG. 4.

In order to be capable of appropriately measuring the angular distribution of the incident beam B illustrated in FIG. 4 and FIGS. 5A to 5D, it is preferable that the measurement device 50 is configured such that the beam parts B1 to B3 respectively portions through the horizontal slits 74$a$ to 74$c$ do not overlap. In other words, it is preferable that the measurement device 50 is configured such that the measurement ranges C1 to C3 respectively corresponding to the beam portions B1 to B3 respectively passing through the horizontal slits 74$a$ to 74$c$ do not overlap with each other. Specifically, it is preferable that the interval (the pitch) d between the horizontal slits 74$a$ to 74$c$ is set such that the beam parts B1 to B3 respectively passing through the horizontal slits 74$a$ to 74$c$ can be sufficiently separated with respect to the ion beam B having an angular distribution allowable for ion implantation processing. For example, preferable is a configuration in which the second beam portion B2 passing through the first upper lateral slit 74$b$ and the third beam part B3 passing through the first lower lateral slit 74$c$ are not incident into the first electrodes 78 in the first measurement range C1 into which the first beam portion B1 passing through the first middle horizontal slit 74$a$ is incident.

Figure 6A:
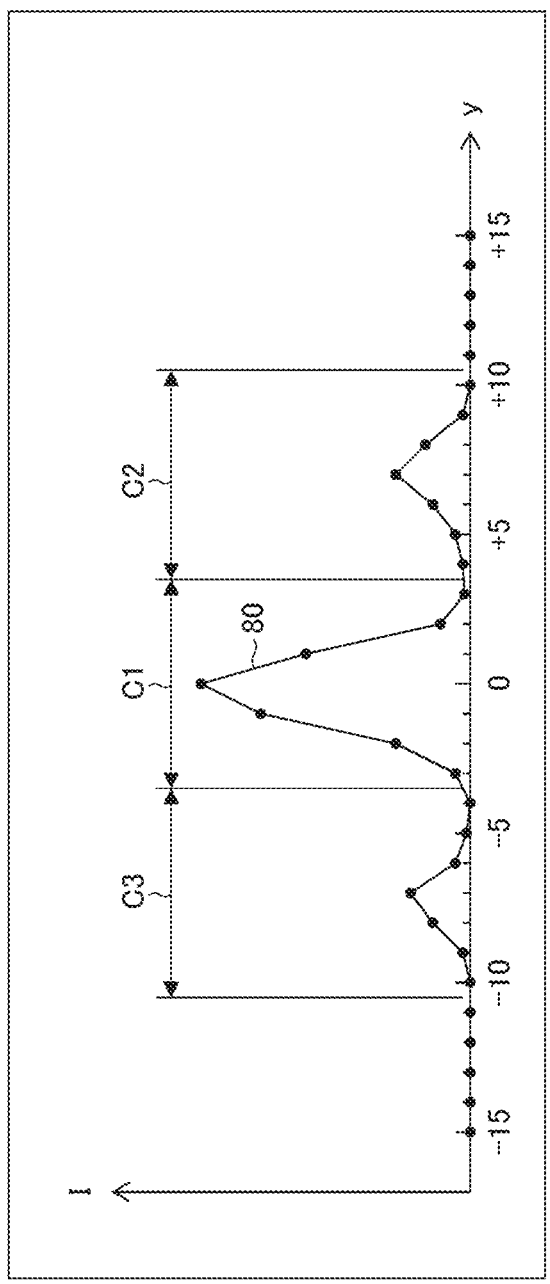
FIGS. 6A and 6B are graphs schematically illustrating results of beam current measurement by the measurement device.
Figure 6B:
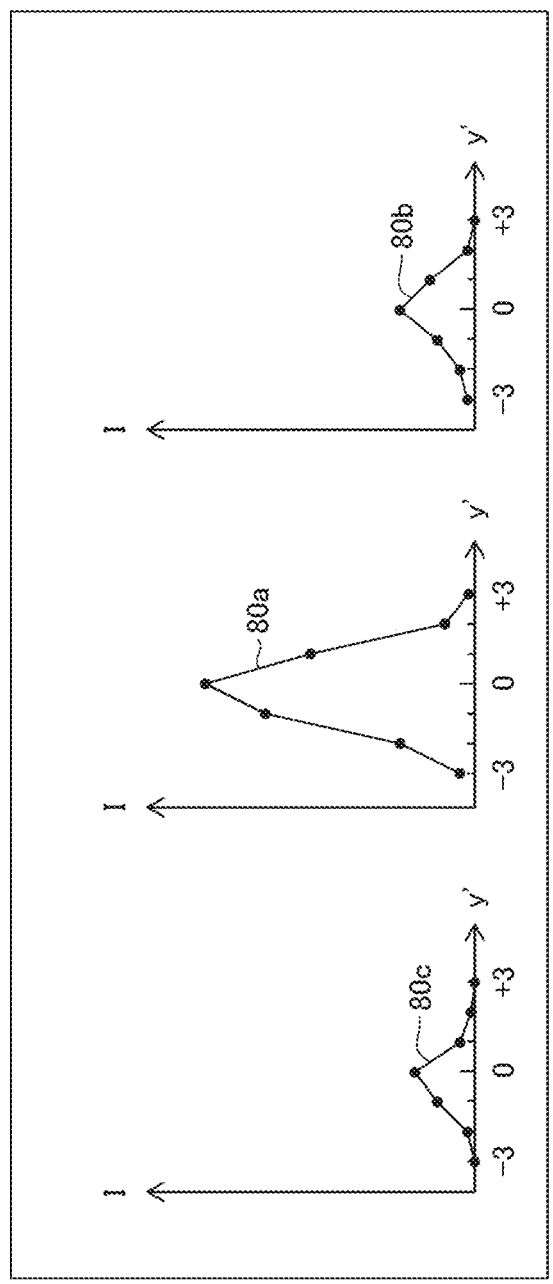

FIGS. 6A and 6B are graphs schematically illustrating results of beam current measurement by the measurement device 50. FIG. 6A is a graph illustrating a beam current value 80 measured by the beam current measurement unit 54. In FIG. 6A, the horizontal axis represents a measurement position in the y direction and the vertical axis represents a current value I. The portion where y=0 corresponds to the first middle electrode 78$a$. The portion where y=+1 to +14 correspond to the first upper electrodes 78$b$1 to 78$o$1, respectively. The portion where y=+15 corresponds to the first upper end electrode 78$p$1. The portion where y=−1 to −14 correspond to the first lower electrodes 78b2 to 78o2, respectively. The portion where y=−15 corresponds to the first lower end electrode 78p2. In FIG. 6A, the first measurement range C1 corresponds to the range of the portion where y=−3 to +3, the second measurement range C2 corresponds to the range of the portion where y=+4 to +10, and the third measurement range C3 corresponds to the range of the portion where y=−10 to −4.

FIG. 6B are graphs illustrating angular distributions 80a, 80b, and 80c of the beam portions B1 to B3 passing through the horizontal slits 74a to 74c, respectively. In FIG. 6B, the horizontal axis y' of the graph is an angle in the y direction measured by the beam current measurement unit 54 and can be represented by y'=dy/dz. For example, the angle y' can be obtained by dividing a deviation of a measurement position y of the beam current measurement unit 54 from a reference position y0 by a distance L in the z direction from the mask plate 52 to the beam current measurement unit 54 (that is, y'=(y−y0)/L). In the graph, y' is normalized with a value (p/L) obtained by dividing the pitch p of the plurality of electrodes 78 by the distance L, where the value (p/L) is regarded as an angular value of "1". The vertical axis I of the graph is a beam current value measured by the beam current measurement unit 54.

The measurement control unit 56 calculates each of the angular distributions 80a to 80c illustrated in FIG. 6B based on the measurement result in FIG. 6A. The measurement control unit 56 divides the graph of the beam current value 80 in FIG. 6A for each of the measurement ranges C1 to C3 and individually sets the position of the central coordinate (the position where y'=0) of the angle y' in accordance with the positions in the y direction of the respective horizontal slits 74a to 74c. For example, in the case of the first measurement range C1, the y position of the first middle horizontal slit 74a is the position where y1=0 (see FIG. 4), and thus the position of y=0 in the graph of the beam current value 80 in FIG. 6A is set to be the central coordinate of the angle y'. In the case of the second measurement range C2, the y position of the first upper horizontal slit 74b is the position where y2=+7 (see FIG. 4), and thus the position of where y=+7 in the graph of the beam current value 80 is set to be the central coordinates of the angle y'. Likewise, in the case of the third measurement range C3, the y position of the first lower horizontal slit 74c is the position where y3=−7 (see FIG. 4), and thus the position where y=−7 in the graph of the beam current value 80 is set to be the central coordinate of the angle y'. Calculated as a result is the distribution of the angle y' (that is, angular distribution) based on the respective y positions (0, +7, and −7) of the horizontal slits 74a to 74c.

In the present embodiment, it is possible to simultaneously measure a plurality of different y-position angular components in the entire of the ion beam B by simultaneously measuring the beam portions B1 to B3 passing through the plurality of horizontal slits 74a to 74c. Further, in the present embodiment, the angular distribution over the entire of the ion beam B is measured while moving the mask plate 52 in the y direction.

Figure 7:
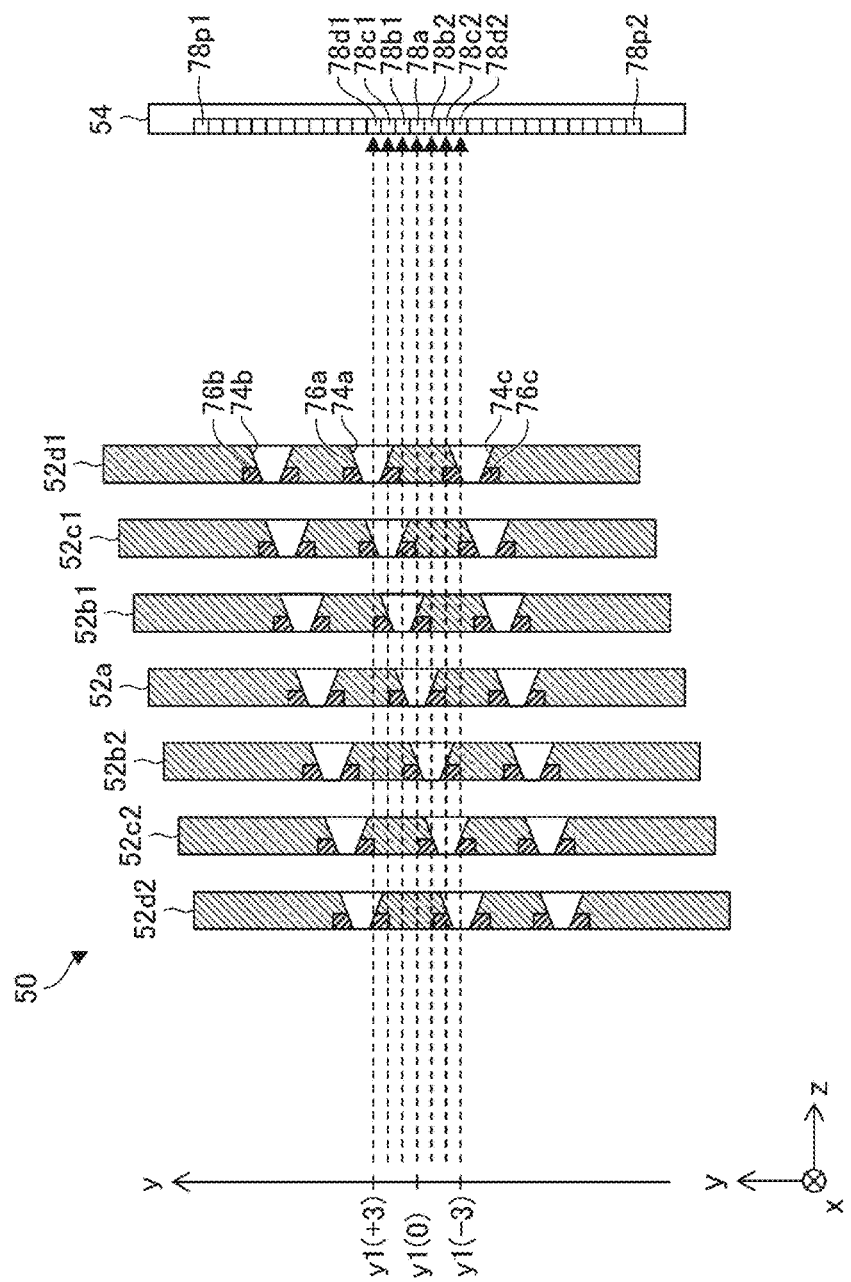
FIG. 7 is a side view schematically illustrating how to move the mask plate.

FIG. 7 is a side view schematically illustrating how to move the mask plate 52. Illustrated in FIG. 7 are mask plates 52d2, 52c2, 52b2, 52a, 52b1, 52c1, and 52d1 respectively shifted in y-direction position by the distance of the slit width w of the horizontal slit 74. Each of the seven illustrated mask plates 52d2 to 52d1 corresponds to a mask plate in which the y position of the first middle horizontal slit 74a is moved in the range of the position where y1=−3 to +3. In this case, the y position of the first upper horizontal slit 74b is the position where y2=+4 to +10, and the y position of the first lower horizontal slit 74c is the positions where y3=−10 to 4. As a result, by moving the mask plate 52 over a range corresponding to the interval (the pitch) d of the horizontal slits 74 (such as a distance six times the slit width w), it is possible to measure the angular distribution of the ion beam B over the range of the positions where y=−10 to +10.

FIG. 8 is a side view schematically illustrating an example of beam angular distribution measurement by the measurement device 50. Illustrated in FIG. 8 is a case where the mask plate 52 is moved such that the y-position movement amount of the mask plate 52 is +3. In FIG. 8, the y position of the first middle horizontal slit 74a is the positions where y1=+3, the y position of the first upper horizontal slit 74b is the positions where y2=+10, and the y position of the first lower horizontal slit 74c is the positions where y3=−4. As a result, the y position of the first upper horizontal slit 74b is a substantially upper end position of the ion beam B incident into the mask plate 52.

Figure 9A:
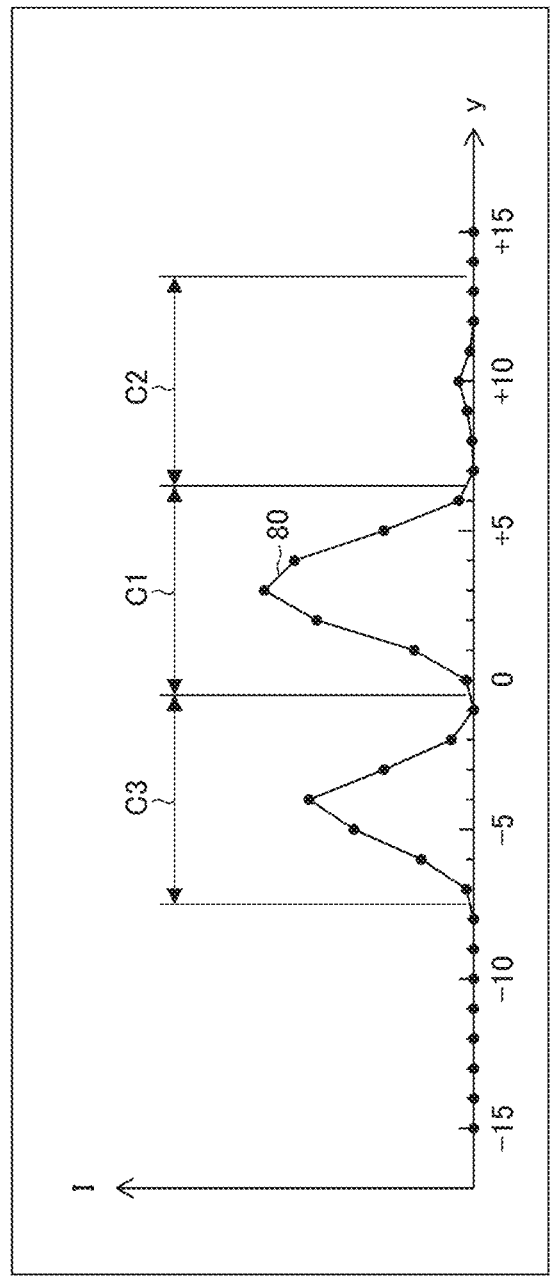
FIGS. 9A and 9B are graphs schematically illustrating results of beam current measurement by the measurement device.
Figure 9B:
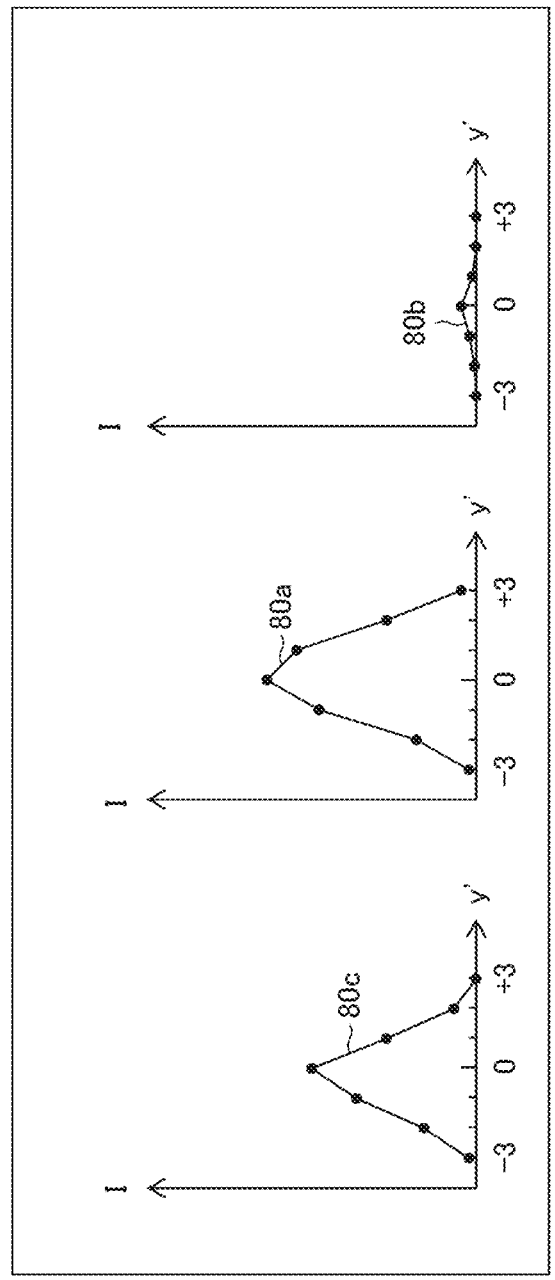

FIGS. 9A and 9B are graphs schematically illustrating results of beam current measurement by the measurement device 50. Illustrated in FIGS. 9A and 9B is a case where the disposition of the mask plate 52 in FIG. 8 is used. The beam current value 80 measured by the beam current measurement unit 54 is illustrated in FIG. 9A. The first measurement range C1 corresponds to the range of the positions where y=0 to +6, the second measurement range C2 corresponds to the range of the positions where y=+7 to +13, and the third measurement range C3 corresponds to the range of the positions where y=−7 to −1. The angular distributions 80a to 80c in FIG. 9B are respectively calculated regarding the beam current value 80 in FIG. 9A and correspond to angular distributions based on the respective y positions (+3, +10, and −4) of the horizontal slits 74a to 74c as reference positions.

The measurement device 50 measures the beam current value 80 at each mask position while moving the mask plate 52 as illustrated in FIG. 7. As a result, it is possible to calculate the angular component of the beam portion at each y position in the range of the positions where y=−10 to +10.

The mask plate 52 may be moved stepwise or continuously. For example, the measurement may be executed at a plurality of mask positions by stepwise moving the mask plate 52 by the distance of the slit width w. In this case, the position of the mask plate 52 is fixed while the beam current is measured by the beam current measurement unit 54, and the beam current measurement is interrupted while the mask plate 52 is moved. The beam current may be measured by the beam current measurement unit 54 while the mask plate 52 is continuously moved. For example, the beam current may be measured while the mask plate 52 is moved at a constant speed. In this case, the beam current values measured while the horizontal slit 74 moves a predetermined distance may be integrated and used as the value for the angular distribution. For example, the integrated value of the beam currents measured while the central position in the y direction of the first middle horizontal slit 74a moves from −0.5 to +0.5 may be adopted as the angular component of the beam portion at the position where y=0.

Figure 10:
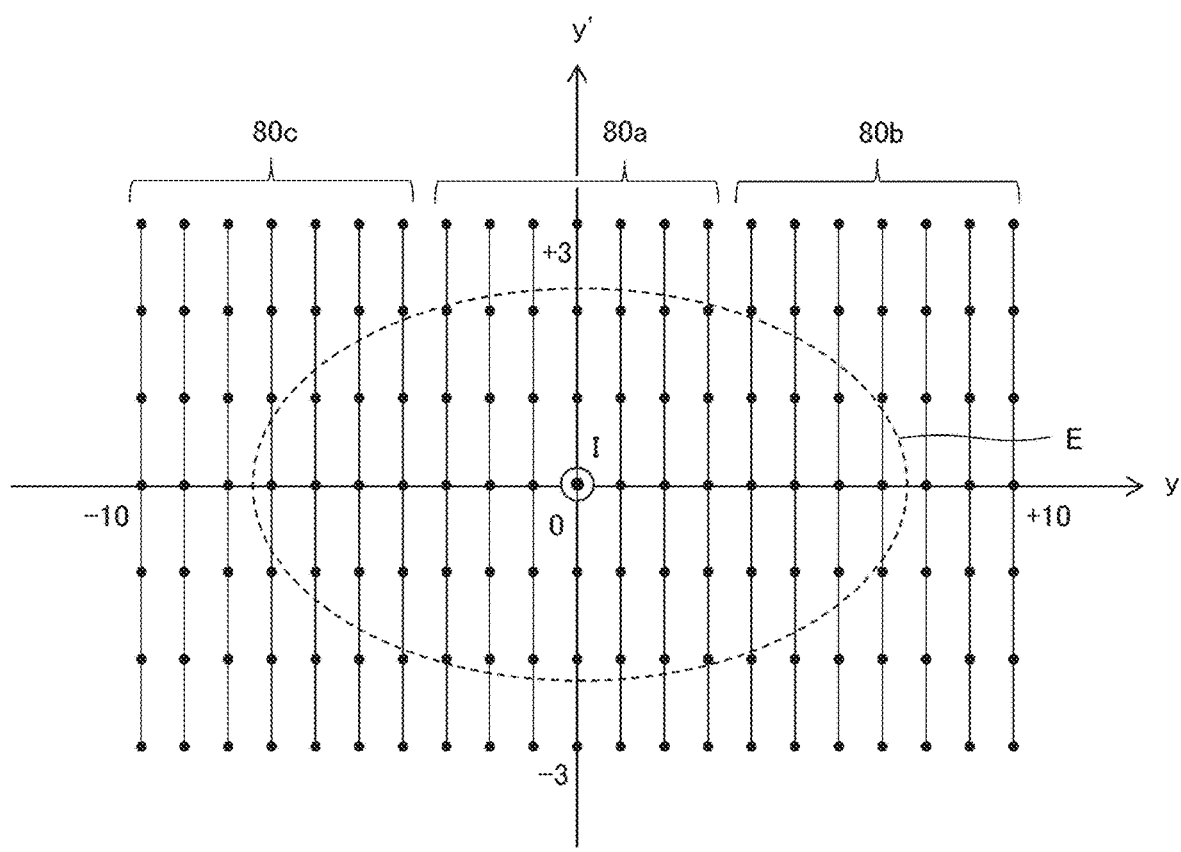
FIG. 10 is a diagram schematically illustrating a phase space distribution of the entire of a beam.

FIG. 10 is a diagram schematically illustrating the phase space distribution of the entire of the ion beam, in which all of the angular distributions 80a to 80c of the beam portions at the respective y positions in the range of the positions where y=−10 to +10 are collected up in one graph. In FIG. 10, the horizontal axis y is the y position of each beam portion, and the vertical axis y' is a y-direction angle. The axis that is perpendicular to a paper surface of FIG. 10 is the current value I. By generating this three-dimensional graph, the measurement control unit 56 calculates the angular distribution (the phase space distribution) in the y direction of the entire of the ion beam B.

The measurement control unit 56 may calculate the distribution shape of the beam on the phase space (also referred to as a phase space profile E) by surrounding an outer edge of a region where the beam current value I is equal to or greater than a predetermined value. For example, the area value of the phase space profile E indicated by the dashed line in FIG. 10 corresponds to an emittance. The measurement control unit 56 may calculate the angular distribution of the entire of the beam represented by the two axes of the angle y' and the current value I by integrating the data illustrated in FIG. 10 along the horizontal axis y. The measurement control unit 56 may calculate the y-direction beam profile of the entire of the beam represented by the two axes of the position y and the current value I by integrating the data illustrated in FIG. 10 along the vertical axis y'.

In order to expedite the calculation of the phase space profile E illustrated in FIG. 10, the measurement control unit 56 may acquire only a part of the beam current values measured at the plurality of first electrodes 78. For example, in a case where the beam current value 80 illustrated in FIG. 6A is acquired, it can be said that only the data over the range of the positions where y=−10 to +10 is necessary and the data over the range of the positions where y=−15 to −11 and the range of the positions where y=+11 to +15 are unnecessary. Likewise, in a case where the beam current value 80 illustrated in FIG. 9A is acquired, it can be said that only the data over the range of the positions where y=−7 to +13 is necessary and the data over the other ranges are unnecessary. In this manner, the measurement control unit 56 may expedite data acquisition by acquiring current value data from only the first electrodes 78 over the range corresponding to each of the measurement ranges C1 to C3 and not acquiring the other data. As a result, it is possible to expedite the calculation of the phase space profile E.

The measurement control unit 56 may verify whether or not the measurement is normally performed based on the current value measured at a part of the first electrodes 78. For example, it may be assumed that the measurement is abnormal and an alert may be output in a case where the current value measured at least one of the first upper end electrode 78p1 and the first lower end electrode 78p2 of the plurality of first electrodes 78, which are positioned at both ends in the y direction, is equal to or greater than a predetermined threshold. In a case where a beam current equal to or greater than a predetermined threshold is measured at least one of the first upper end electrode 78p1 and the first lower end electrode 78p2, it is estimated that the beam reaches outside the region where the plurality of first electrodes 78 are provided as well and the validity of the measured angular distribution is suspected.

The measurement control unit 56 may verify whether or not the measurement is normally performed based on the current values measured at the plurality of first electrodes 78 and the current values detected by the plurality of first beam current detection units 76. For example, the measurement control unit 56 may confirm whether or not the magnitude relationship of the beam current values respectively measured for the first measurement range C1, the second measurement range C2, and the third measurement range C3 of the plurality of first electrodes 78 and the magnitude relationship of the beam current values respectively detected by the plurality of first beam current detection units 76a to 76c correspond to each other. For example, in a case where the measurement result of the beam current measurement unit 54 is as illustrated in FIG. 6A, a relatively large current detection amount of the first middle beam current detection unit 76a and relatively small current detection amounts of the first upper beam current detection unit 76b and the first lower beam current detection unit 76c are regarded as being appropriate. In a case where the measurement result of the beam current measurement unit 54 is as illustrated in FIG. 9A, relatively large current detection amounts of the first middle beam current detection unit 76a and the first lower beam current detection unit 76c and a relatively very small current detection amount of the first upper beam current detection unit 76b are regarded as being appropriate. When this relationship is not met, the measurement is regarded as being abnormal. In this case, the beam current measurement unit 54 may output an alert.

Figure 11:
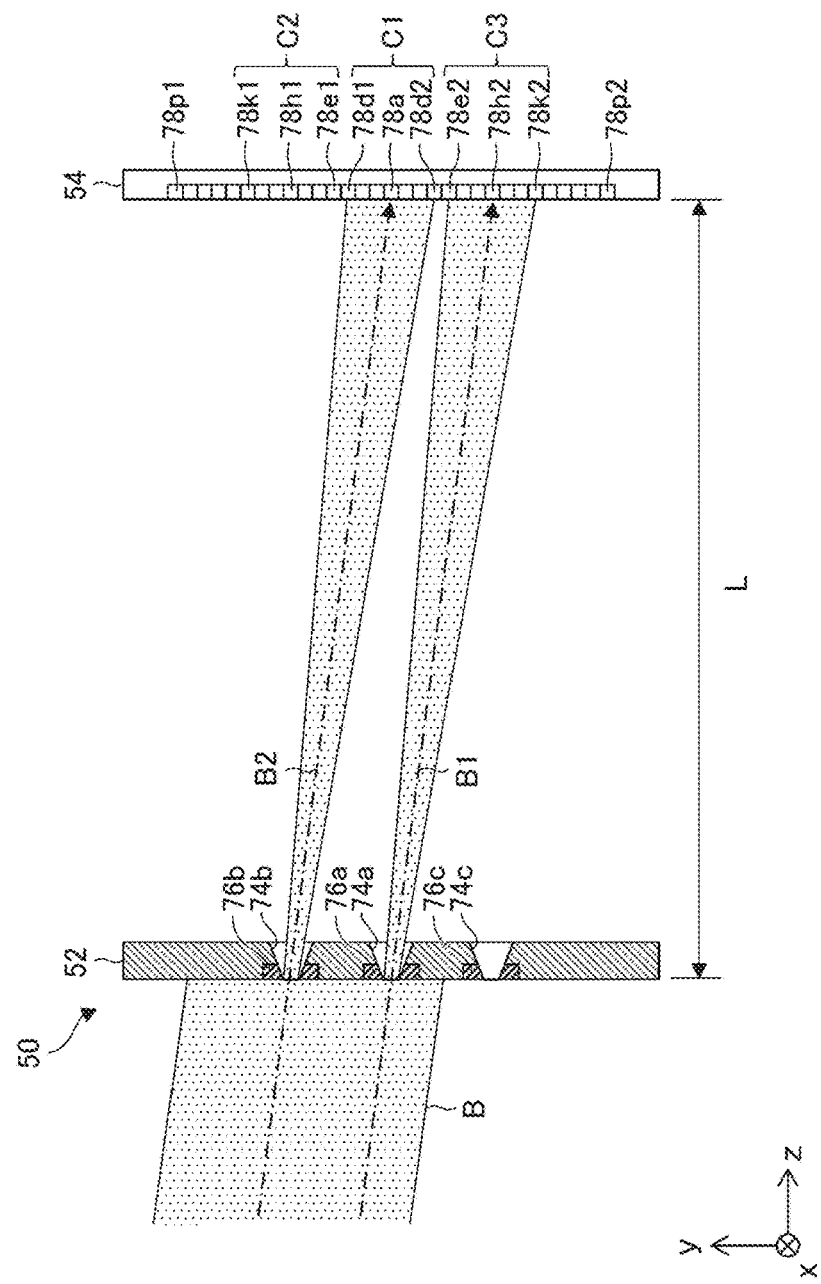
FIG. 11 is a side view schematically illustrating an example of beam measurement determined to be abnormal.

FIG. 11 is a side view schematically illustrating an example of beam measurement determined to be abnormal. In FIG. 11, the trajectory of the ion beam B is greatly inclined with respect to the z direction, the first beam portion B1 passing through the first middle horizontal slit 74a is incident into the third measurement range C3, and the second beam portion B2 passing through the first upper horizontal slit 74b is incident into the first measurement range C1. As a result, the correspondence relationship between the three horizontal slits 74a to 74c and the three measurement ranges C1 to C3 is mistaken. In such a case, a phase space distribution that is very different from the actual phase space distribution is calculated when the angular components are calculated based solely on the measurement result of the beam current measurement unit 54 on the assumption that the three horizontal slits 74a to 74c and the three measurement ranges C1 to C3 correspond to each other.

By referring to the current detection values of the three first beam current detection units 76a to 76c, it is possible to confirm the mistake of the correspondence relationship described above. In the case of FIG. 11, no beam current is measured in the second measurement range C2 despite the fact that the current is detected by the first upper beam current detection unit 76b, and the beam current is measured in the third measurement range C3 despite the fact that no current is detected by the first lower beam current detection unit 76c, and thus it is possible to find the mistake of the correspondence relationship described above. It is possible to verify whether or not the measurement is normal by comparing the current values measured at the plurality of first electrodes 78 with the current values detected by the plurality of first beam current detection units 76 in this manner.

The measurement control unit 56 may determine whether or not the measurement is normal based on, for example, the values of current ratios $IC_i/ID_i$ (i=1, 2, 3), where IC1 to IC3 are total values of the beam currents respectively measured in the measurement ranges C1 to C3 and ID1 to ID3 are beam currents respectively detected by the first beam current detection units 76a to 76c. For example, the measurement control unit 56 may determine that the measurement is normal when the variation of the current ratio $IC_i/ID_i$ is within a predetermined range and may determine that the measurement is abnormal otherwise. Peak value of the beam currents respectively measured in the measurement ranges C1 to C3 may be used as indexes instead of the total values of the beam currents respectively measured in the measurement ranges C1 to C3.

The measurement device 50 is configured to operate in a plurality of measurement modes and may operate in any one of a first mode and a second mode. The first mode is an operation mode for measuring the angular distribution over the entire of the beam, and the second mode is an operation mode for measuring the angular distribution of only a part of the entire of the beam. In the first mode, the phase space profile E as illustrated in FIG. 10 is plotted. In the second mode, the phase space profile is plotted based on a smaller number of data than in FIG. 10. In the second mode, the measurement accuracy degrades due to the small number of data. Still, the measurement can be expedited, and thus it is possible to obtain approximate angular distribution information within a short time.

Figure 12:
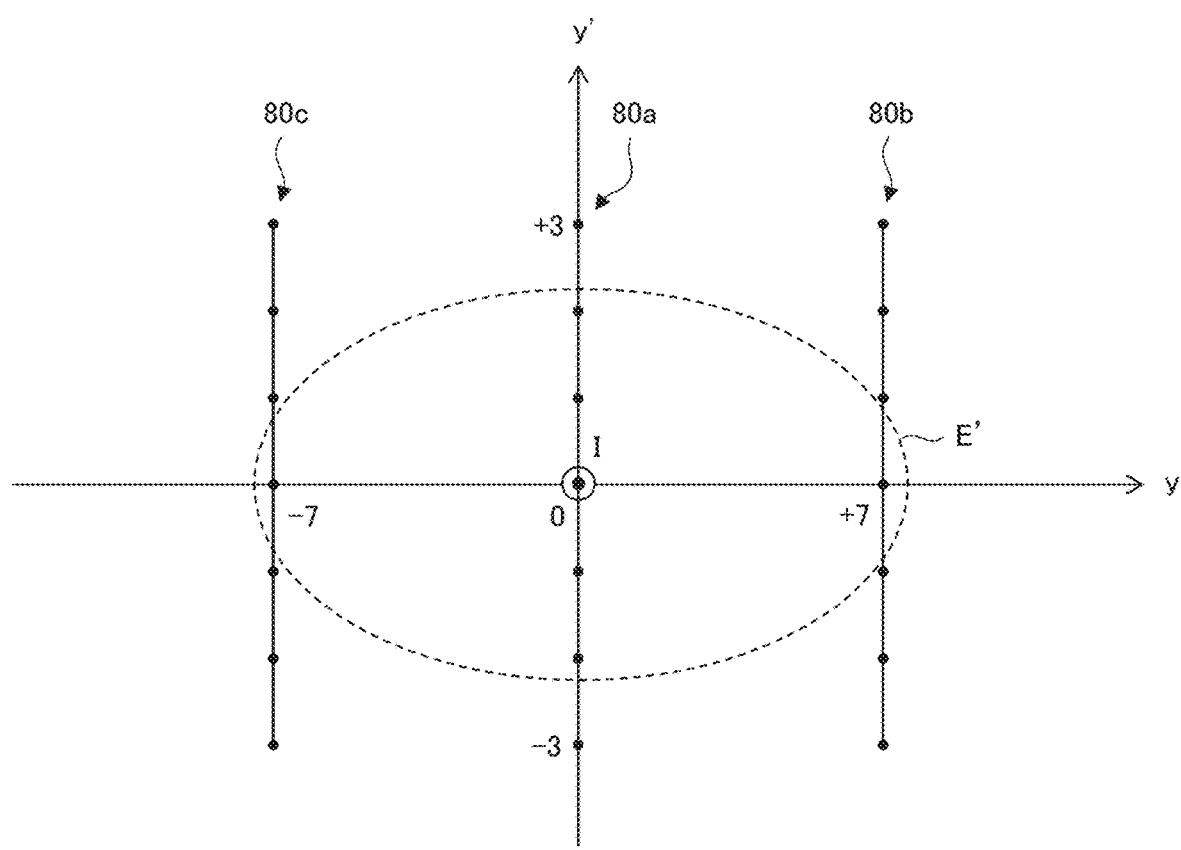
FIG. 12 is a diagram schematically illustrating a partial phase space distribution of entire of the beam.

FIG. 12 is a diagram schematically illustrating a partial phase space profile E' of the entire of the beam and illustrating an example of measurement in the second mode. Since the phase space distribution illustrated in FIG. 12 is composed of only the three angular distributions 80a, 80b, and 80c, the mask plate 52 does not need to be moved and the measurement can be performed within a short time. In addition, since each of the three angular distributions 80a to 80c is separated in the y direction, it is also possible to grasp the approximate (partial) phase space profile E' from only the three groups of information. For example, it is possible to easily confirm the beam quality in a case where the overall phase space profile E is plotted in the first mode before ion implantation processing initiation, the approximate phase space profile E' is plotted in the second mode during the ion implantation processing, and the phase space profile E' is compared with the pre-plotted highly accurate phase space profile E. The measurement time in the second mode is relatively short, and thus it is possible to complete the measurement during, for example, replacement of the wafer W. In addition, in a case where beam adjustment is performed at a plurality of arbitrary timings, it is possible to easily confirm the beam quality by acquiring the plot of the phase space profile E in the first mode in the initial beam adjustment, acquiring the plot of the approximate phase space profile E' in the second mode in the beam adjustment at subsequent arbitrary timings, and comparing the plot of the approximate phase space profile E' with the plot of the initial phase space profile E. By the use of the second mode, the beam quality can be easily confirmed without significantly degrading the throughput of the implantation processing.

Also, the measurement in the second mode may be performed while the mask plate 52 is moved. For example, the measurement in the second mode may be executed by moving the mask plate 52 over a second distance (such as three times the slit width w) smaller than a first distance (such as six times the slit width w) which is the moving distance in the first direction of the mask plate 52 in the first mode). In this case, in the second mode, the beam current value may be measured at a smaller number of mask positions such as two positions or three positions than in the first mode. As a result, it is simultaneously possible to realize a relatively short measurement time and improvement of measurement accuracy.

Methods for calculating the phase space distribution in the y direction of the beam by using the plurality of first horizontal slits 74a to 74c and the plurality of first electrodes 78 has been described above with reference to FIGS. 4 to 10. The phase space distribution in the y direction can also be calculated in a similar manner by using the plurality of second horizontal slits 75a to 75c and the plurality of second electrodes 79. Also, the phase space distribution of the ion beam B may be calculated based on a combination between the measurement results of the plurality of first electrodes 78 and the plurality of second electrodes 79 or the beam quality may be confirmed by comparing the measurement results of the plurality of first electrodes 78 and the plurality of second electrodes 79 with each other.

Figure 13:
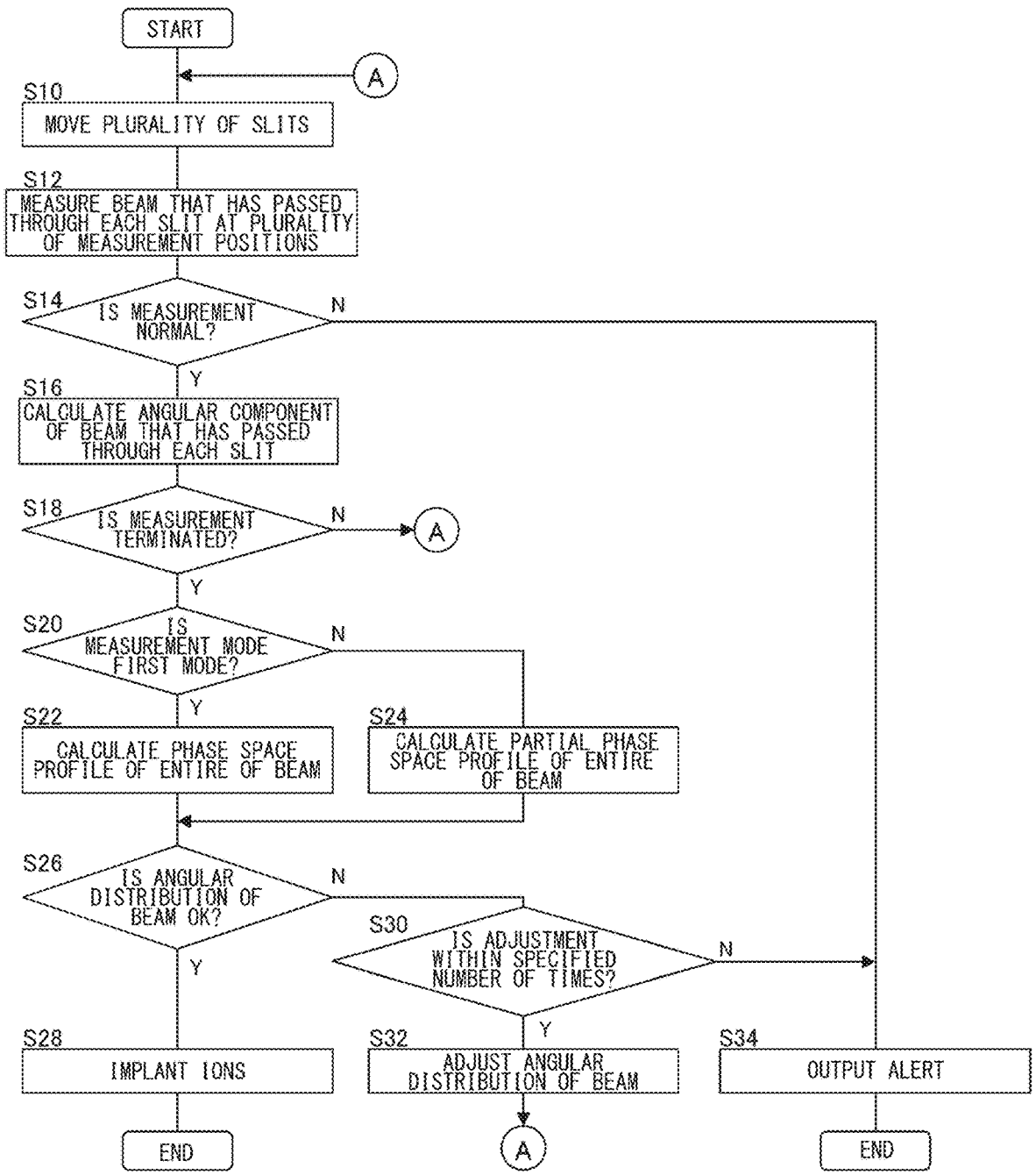
FIG. 13 is a flowchart illustrating the flow of an ion implantation method according to the embodiment.

FIG. 13 is a flowchart illustrating the flow of the ion implantation method according to the embodiment. The mask plate 52 provided with the plurality of slits is moved onto the beam trajectory (S10), and the beam portion that has passed through each slit is measured at the plurality of measurement positions (plurality of electrodes) to be different positions in the y direction (S12). When the measurement is normal (Y in S14), the angular component of the beam portion that has passed through each slit is calculated (S16). When the measurement is yet to be completed (N in S18), the position in the y direction of the slit is changed by moving the mask plate 52 (S10), and the processing of S12 to S16 is executed. Subsequently, the processing of S10 to S16 is repeated until measurement completion. Once the measurement is completed (Y in S18) and the measurement mode is the first mode (Y in S20), the phase space profile E of the entire of the beam is calculated (S22). Then, the ion implantation processing is executed (S28) and this flow is completed on condition that the calculated phase space profile E is allowable and the angular distribution of the beam is OK (Y in S26).

In a case where the measurement mode is not the first mode but the second mode in S20 (N in S20), the partial phase space profile E' of the entire of the beam is calculated (S24). The phase space profile E of the entire of the beam calculated in the first mode as a preliminary and the partial phase space profile E' calculated in the second mode are compared with each other (S26). When the result of the comparison is allowable and the angular distribution of the beam is OK (Y in S26), the ion implantation processing is executed (S28) and this flow is completed.

When the phase space profile E measured in the first mode is not allowable and the angular distribution of the beam is NG in S26 (N in S26) and a cumulative number of times of beam adjustments is within a specified number of times (Y in S30), the angular distribution of the beam is adjusted (S32) and the phase space profile E is calculated by executing again the processing of S10 to S22. When the phase space profile E' measured in the second mode is not allowable and the angular distribution of the beam is NG in S26 (N in S26) and the cumulative number of times of beam adjustments is within the specified number of times (Y in S30), the angular distribution of the beam is adjusted (S32) and the phase space profile E is calculated by executing the processing of S10 to S22 with the first mode selected. In a case where the phase space profile E is still not allowable (N in S26) and the cumulative number of times of beam adjustments exceeds the specified number of times (N in S30), an alert is output (S34) and this flow is completed. When the measurement is abnormal in S14 (N in S14), an alert is output (S34) and this flow is completed.

According to the present embodiment, the angular distribution in the y direction is measured by means of the plurality of horizontal slits 74 and 75 lining up in the y direction, and thus it is possible to shorten the time required for measuring the angular distribution in the y direction of the ion beam B. In a case where the angular distribution of the entire of the beam is measured, the measurement can be completed in one-third of the time that is required in a case where only one horizontal slit is used as the three horizontal slits 74 and 75 are used. In addition, even in a case where the partial angular distribution of the beam is measured, it is possible to simultaneously measure the angular distribution of the beam portions at a plurality of positions (such as three positions) separated in they direction without any movement of the horizontal slit position. Accordingly, the approximate angular distribution of the entire of the beam can be obtained within an extremely short time, and the angular distribution of the beam can be evaluated with speed, accuracy, and ease.

The invention has been described above based on the embodiment. It is to be understood by those skilled in the art that the invention is not limited to the above embodiment, various design changes are possible, various modification examples are possible, and such modification examples are also within the scope of the embodiments of the invention.

Figure 14:
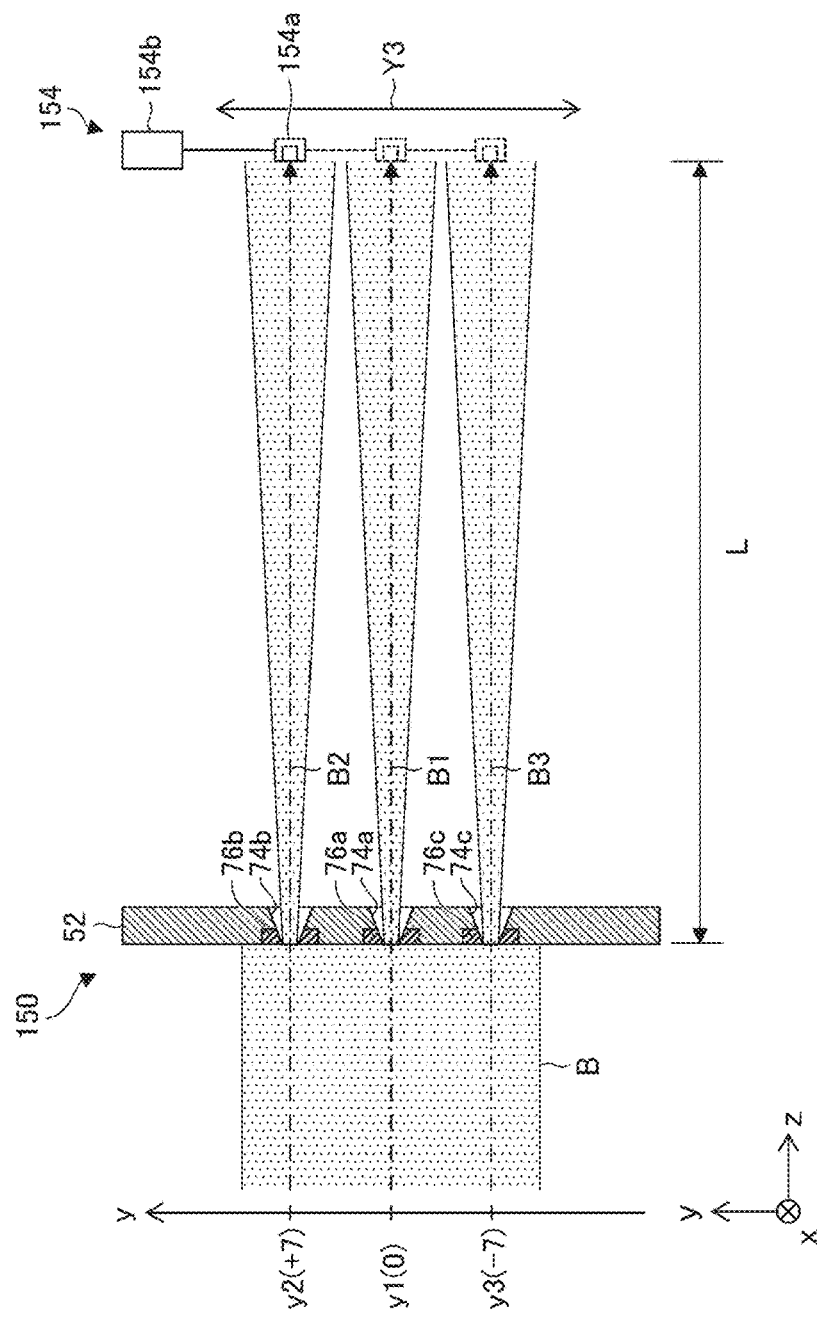
FIG. 14 is a side view schematically illustrating an example of beam angular distribution measurement by a measurement device according to a modification example.

FIG. 14 is a side view schematically illustrating an angular distribution measurement of the beam by a measurement device 150 according to a modification example. In the present modification example, the beam current is measured by means of a Faraday cup 154a provided with at least one electrode movable in the y direction instead of the plurality of first electrodes 78 and the plurality of second electrodes 79. A beam current measurement unit 154 includes the Faraday cup 154a and a moving mechanism 154b. The moving mechanism 154b moves the Faraday cup 154a in the y direction. As a result, the Faraday cup 154a is disposed at a plurality of measurement positions to be different positions in the y direction. The plurality of measurement positions at which the Faraday cup 154a can be disposed correspond to the positions of the plurality of first electrodes 78 or the plurality of second electrodes 79 according to the embodiment described above.

In the present modification example, the Faraday cup 154a is moved along an arrow Y3 and then the beam current is measured at the plurality of measurement positions to be different positions in the y direction after the mask plate 52 is disposed on the beam trajectory. Subsequently, the mask plate 52 is moved in the y direction to another mask position, the Faraday cup 154a is moved again along the arrow Y3, and the beam current is measured at the plurality of measurement positions to be different positions in they direction. By repeating such process, it is possible to calculate the angular distribution of the entire of the ion beam B.

According to the embodiment described above, the measurement is determined to be abnormal and an alert is output in a case where the current values measured at the plurality of first electrodes 78 do not correspond to the current values detected by the plurality of first beam current detection units 76. In a modification example, the position of the central coordinate of the angle y' at the calculation of the angular distribution may be adjusted based on the correspondence relationship between the current values measured at the plurality of first electrodes 78 and the current values detected by the plurality of first beam current detection units 76. For example, in a case where the ion beam B illustrated in FIG. 11 is incident, it can be understood from the above-described correspondence relationship that the first beam portion B1 passing through the first middle horizontal slit 74a is measured in the third measurement range C3 and the second beam portion B2 passing through the first upper horizontal slit 74b is measured in the first measurement range C1. In this regard, the beam current measured in the third measurement range C3 may be adopted to calculate the angular distribution of the first beam portion B1 and the beam current measured in the first measurement range C1 may be adopted to calculate the angular distribution of the second beam portion B2. In this case, the y position of the first middle horizontal slit 74a is the position where y1=0, and thus the position where y=0 may be the central coordinates of the angle y' in the calculation of the angular distribution of the beam portion measured in the third measurement range C3. Likewise, the y position of the first upper horizontal slit 74b is the position where y2=+7, and thus the position where y=+7 may be the central coordinate of the angle y' in the calculation of the angular distribution of the beam portion measured in the first measurement range C1. In other words, the method for setting the central coordinate of y' in the angular distribution may be changed based on the correspondence relationship described above.

In the embodiment described above, the beam current detection units 76 and 77 are provided around the plurality of horizontal slits 74 and 75. The beam current detection units 76 and 77 may not be provided in another modification example.

In the embodiment described above, the measurement device 50 is configured to measure the angular distribution in the y direction of the ion beam B. In another modification example, the measurement device 50 may be configured to measure the angular distribution in the x direction of the ion beam B or to measure the angular distribution in any direction perpendicular to the beam traveling direction.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
   a beamline device configured to transport an ion beam with which a wafer is irradiated; and
   a measurement device configured to measure angle information on the ion beam,
   wherein the measurement device includes a plurality of slits through which a part of the ion beam passes, a beam current measurement unit provided at a position away from the plurality of slits in a beam traveling direction, and a measurement control unit,
   wherein the beam current measurement unit is configured to be capable of measuring a beam current at a plurality of measurement positions to be different positions in a first direction perpendicular to the beam traveling direction,
   wherein the plurality of slits are disposed to be spaced apart in the first direction such that the first direction coincides with a slit width direction and are configured to be movable in the first direction, and
   wherein the measurement control unit is configured to:
      execute a first mode in which a plurality of beam current values measured at the plurality of measurement positions to be the different positions in the first direction are acquired with the beam current measurement unit while moving the plurality of slits over a first distance in the first direction,
      execute a second mode in which the plurality of beam current values measured at the plurality of measurement positions to be the different positions in the first direction are acquired while the plurality of slits are fixed or moved over a second distance smaller than the first distance in the first direction, and
      compare angle information on the ion beam measured in the second mode with angle information on the ion beam measured in the first mode as a preliminary.

2. The ion implantation apparatus according to claim 1, wherein the measurement control unit calculates angular distribution in the first direction of the entire of the ion beam based on positions of the plurality of slits in the first direction and the plurality of beam current values measured at the plurality of measurement positions to be the different positions in the first direction.

3. The ion implantation apparatus according to claim 1, wherein the measurement control unit calculates phase space distribution in the first direction of the ion beam based on positions of the plurality of slits in the first direction and the plurality of beam current values measured at the plurality of measurement positions to be the different positions in the first direction.

4. The ion implantation apparatus according to claim 1, wherein the measurement control unit acquires the plurality of beam current values measured at the plurality of measurement positions to be the different positions in the first direction while moving the plurality of slits by the same distance as a slit width in the first direction.

5. The ion implantation apparatus according to claim 1, wherein the measurement control unit acquires the plurality of beam current values measured at the plurality of measurement positions to be the different positions in the first direction while moving the plurality of slits at a constant speed in the first direction.

6. The ion implantation apparatus according to claim 1, wherein the measurement control unit moves the plurality of slits over the same distance as an interval between a pair of adjacent slits of the plurality of slits in the first direction.

7. The ion implantation apparatus according to claim 1, wherein an interval between a pair of adjacent slits of the plurality of slits in the first direction is an integer multiple of the slit width.

8. The ion implantation apparatus according to claim 1, wherein the plurality of slits include a first slit and a second slit provided adjacent to the first slit in the first direction, and
wherein an interval between the first slit and the second slit is set such that a second part of the ion beam passing through the second slit does not enter one or more measurement positions where a first part of the ion beam passing through the first slit can be measured.

9. The ion implantation apparatus according to claim 1, wherein the measurement device includes one beam shielding body including the plurality of slits.

10. The ion implantation apparatus according to claim 1, wherein the plurality of slits include a first end portion slit and a second end portion slit respectively disposed at both ends in the first direction, and
wherein the beam current measurement unit is configured to be capable of measuring the beam current at the plurality of measurement positions to be the different positions in the first direction over a section longer than a distance from the first end portion slit to the second end portion slit in the first direction.

11. The ion implantation apparatus according to claim 10, wherein the beam current measurement unit is configured to be capable of measuring the beam current at the plurality of measurement positions to be the different positions in the first direction over a section longer than the total of the distance from the first end portion slit to the second end portion slit in the first direction and a moving distance of the plurality of slits in the first direction.

12. The ion implantation apparatus according to claim 1, wherein the measurement control unit outputs an alert in a case where the current value measured at at least one of a first end portion measurement position and a second end portion measurement position respectively positioned at both ends in the first direction among the plurality of measurement positions of the beam current measurement unit is equal to or greater than a predetermined threshold.

13. The ion implantation apparatus according to claim 1, wherein the wafer is irradiated with the ion beam in a case where the result of the comparison satisfies a predetermined condition.

14. The ion implantation apparatus according to claim 1, wherein the measurement device outputs an alert in a case where the result of the comparison does not satisfy a predetermined condition.

15. The ion implantation apparatus according to claim 1, wherein the measurement device re-measures the angle information on the ion beam in the first mode and adjusts an operation parameter of the beamline device based on the result of the re-measurement in the first mode, in a case where the result of the comparison does not satisfy a predetermined condition.

16. The ion implantation apparatus according to claim 1, wherein the beamline device includes a scanner which conducts reciprocating scanning with the ion beam in a second direction perpendicular to the beam traveling direction and the first direction, and
wherein the measurement device measures angle information in the first direction on the ion beam going through the reciprocating scanning in the second direction.

17. The ion implantation apparatus according to claim 1, wherein the beam current measurement unit has a plurality of electrodes respectively provided at the plurality of measurement positions to be the different positions in the first direction.

18. The ion implantation apparatus according to claim 1, wherein the beam current measurement unit has one or more electrodes and a moving mechanism which moves the one or more electrodes to the plurality of measurement positions to be the different positions in the first direction.

19. An ion implantation apparatus comprising:
a beamline device configured to transport an ion beam with which a wafer is irradiated; and
a measurement device configured to measure angle information on the ion beam,
wherein the measurement device includes a plurality of slits through which a part of the ion beam passes, a beam current measurement unit provided at a position away from the plurality of slits in a beam traveling direction, and a measurement control unit,
wherein the measurement device further includes a plurality of beam current detection units respectively provided adjacent to the plurality of slits,
wherein the beam current measurement unit is configured to be capable of measuring a beam current at a plurality of measurement positions to be different positions in a first direction perpendicular to the beam traveling direction,
wherein the plurality of slits are disposed to be spaced apart in the first direction such that the first direction coincides with a slit width direction and are configured to be movable in the first direction, and
wherein the measurement control unit acquires a plurality of beam current values measured at the plurality of measurement positions to be the different positions in the first direction with the beam current measurement unit while moving the plurality of slits in the first direction.

20. The ion implantation apparatus according to claim 19, wherein the measurement control unit compares beam current values detected by the plurality of beam current detection units with the plurality of beam current values measured at the plurality of measurement positions to be the different positions in the first direction with the beam current measurement unit and then outputs an alert in a case where the result of the comparison does not satisfy a predetermined condition.

21. The ion implantation apparatus according to claim 19, wherein the measurement control unit calculates the phase space distribution in the first direction of the ion beam based on beam current values detected by the plurality of beam current detection units, the positions of the plurality of slits in the first direction, and the plurality of beam current values measured at the plurality of measurement positions to be the different positions in the first direction.

22. A measurement device measuring angle information on an ion beam, comprising:
   a plurality of slits through which a part of the ion beam passes;
   a beam current measurement unit that is provided at a position away from the plurality of slits in a beam traveling direction; and
   a measurement control unit,
   wherein the beam current measurement unit is configured to be capable of measuring a beam current at a plurality of measurement positions to be different positions in a first direction perpendicular to the beam traveling direction,
   wherein the plurality of slits are disposed to be spaced apart in the first direction such that the first direction coincides with a slit width direction and are configured to be movable in the first direction, and
   wherein the measurement control unit is configured to:
   execute a first mode in which a plurality of beam current values measured at the plurality of measurement positions to be the different positions in the first direction are acquired with the beam current measurement unit while moving the plurality of slits over a first distance in the first direction,
   execute a second mode in which the plurality of beam current values measured at the plurality of measurement positions to be the different positions in the first direction are acquired while the plurality of slits are fixed or moved over a second distance smaller than the first distance in the first direction, and
   compare angle information on the ion beam measured in the second mode with angle information on the ion beam measured in the first mode as a preliminary.

23. A method for measuring angle information of an ion beam comprising:
   executing a first mode in which a plurality of slits through which a part of the ion beam passes moves over a first distance in a first direction perpendicular to a beam traveling direction, and a plurality of beam current values are measured at a plurality of measurement positions to be different positions in the first direction and away from the plurality of slits in the beam traveling direction;
   executing a second mode in which the plurality of slits are fixed or moved over a second distance smaller than the first distance in the first direction, and the plurality of beam current values are measured at the plurality of measurement positions to be the different positions in the first direction; and
   comparing angle information on the ion beam measured in the second mode with angle information on the ion beam measured in the first mode as a preliminary.

* * * * *